US012581670B2

(12) United States Patent
Chuang

(10) Patent No.: US 12,581,670 B2
(45) Date of Patent: Mar. 17, 2026

(54) SEMICONDUCTOR DEVICE WITH PROGRAMMABLE INSULATING LAYER AND METHOD FOR FABRICATING THE SAME

(71) Applicant: NANYA TECHNOLOGY CORPORATION, New Taipei City (TW)

(72) Inventor: Ying-Cheng Chuang, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 377 days.

(21) Appl. No.: 18/224,185

(22) Filed: Jul. 20, 2023

(65) Prior Publication Data

US 2025/0031390 A1     Jan. 23, 2025

(51) Int. Cl.
H10B 20/00        (2023.01)
H10B 99/00        (2023.01)
(Continued)

(52) U.S. Cl.
CPC ............... H10D 1/40 (2025.01); H10B 99/22 (2023.02); H10D 48/021 (2025.01); H10D 64/23 (2025.01)

(58) Field of Classification Search
CPC ............... H01L 23/525; H01L 23/5252; H01L 23/5256; H01L 23/5258; H10B 20/00; H10B 20/10; H10B 20/20; H10B 20/25; H10B 20/27; H10B 20/34; H10B 20/30; H10B 20/36; H10B 20/363; H10B 20/367; H10B 20/38; H10B 20/383; H10B 20/387; H10B 20/50; H10B 20/40; H10B 63/10; H10B 63/20; H10B 63/22; H10B 63/24; H10B 63/30; H10B 63/32; H10B 63/34;
(Continued)

(56) References Cited

U.S. PATENT DOCUMENTS 6,396,120 B1 *  5/2002  Bertin .................. H10D 30/674
                                                    257/E21.624
7,795,094 B2 *  9/2010  Kreipl .................... H10B 20/25
                                                    438/281
(Continued)

FOREIGN PATENT DOCUMENTS

TW      201526237 A     7/2015
TW      202213723 A     4/2022

OTHER PUBLICATIONS

Office Action and search report mailed on Jun. 21, 2024 related to Taiwanese Application No. 112130265.
(Continued)

*Primary Examiner* — Eric A. Ward
(74) *Attorney, Agent, or Firm* — Xuan Zhang

(57)        ABSTRACT

The present application discloses a semiconductor device and a method for fabricating the semiconductor device. The semiconductor device includes a substrate; a valley inwardly positioned on a top surface of the substrate; a programmable insulating layer conformally positioned on the valley and including a V-shaped cross-sectional profile; and a top electrode positioned on the programmable insulating layer. The programmable insulating layer is configured to be blown out under a programming voltage.

8 Claims, 29 Drawing Sheets

(51) Int. Cl.
 H10D 1/40 (2025.01)
 H10D 48/01 (2025.01)
 H10D 64/23 (2025.01)

(58) Field of Classification Search
 CPC ........ H10B 63/80; H10B 63/82; H10B 63/84;
 H10B 63/845; H10N 70/826; H10N
 70/8265; G11C 17/16; G11C 17/165
 See application file for complete search history.

(56) References Cited

U.S. PATENT DOCUMENTS

| | | | | |
|---|---|---|---|---|
| 8,772,907 | B1 * | 7/2014 | Ho ........................ | H01L 21/768 257/530 |
| 10,056,329 | B1 * | 8/2018 | Adusumilli ......... | H01L 23/5252 |
| 2021/0408264 | A1 * | 12/2021 | Huang .................. | H10D 30/62 |

OTHER PUBLICATIONS

Office Action and and the search report mailed on Feb. 12, 2025 related to Taiwanese Application No. 113112592.

Summary translation of Office Action and and the search report mailed on Feb. 12, 2025 related to Taiwanese Application No. 113112592.

* cited by examiner

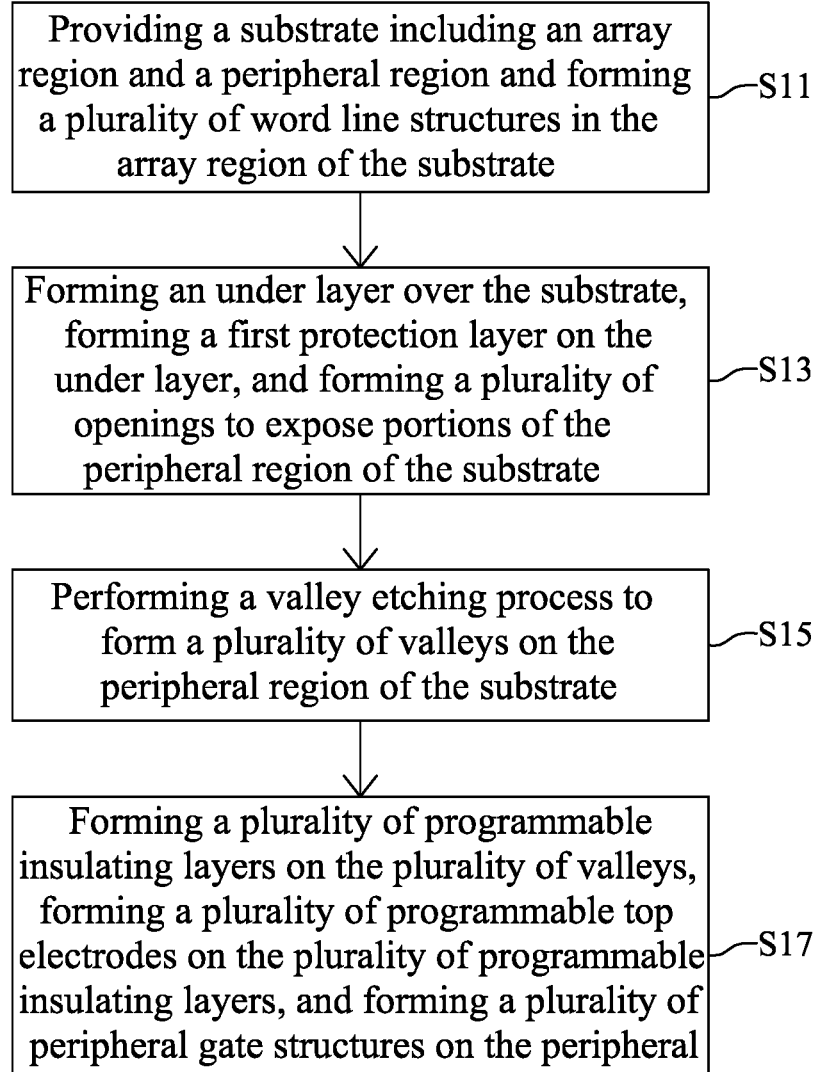

10

Providing a substrate including an array region and a peripheral region and forming a plurality of word line structures in the array region of the substrate    S11

Forming an under layer over the substrate, forming a first protection layer on the under layer, and forming a plurality of openings to expose portions of the peripheral region of the substrate    S13

Performing a valley etching process to form a plurality of valleys on the peripheral region of the substrate    S15

Forming a plurality of programmable insulating layers on the plurality of valleys, forming a plurality of programmable top electrodes on the plurality of programmable insulating layers, and forming a plurality of peripheral gate structures on the peripheral region of the substrate    S17

FIG. 1

SEMICONDUCTOR DEVICE WITH PROGRAMMABLE INSULATING LAYER AND METHOD FOR FABRICATING THE SAME

TECHNICAL FIELD

The present disclosure relates to a semiconductor device and a method for fabricating the semiconductor device, and more particularly, to a semiconductor device with a programmable insulating layer and a method for fabricating the semiconductor device with the programmable insulating layer.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a valley inwardly positioned on a top surface of the substrate; a programmable insulating layer conformally positioned on the valley and including a V-shaped cross-sectional profile; and a top electrode positioned on the programmable insulating layer. The programmable insulating layer is configured to be blown out under a programming voltage.

Another aspect of the present disclosure provides a semiconductor device including a substrate including an array region and a peripheral region positioned adjacent to the array region; a valley inwardly positioned on a top surface of the peripheral region of the substrate; a programmable insulating layer conformally positioned on the valley and including a V-shaped cross-sectional profile; a top electrode positioned on the programmable insulating layer; a peripheral gate structure positioned on the top surface of the peripheral region of the substrate. The programmable insulating layer is configured to be blown out under a programming voltage.

Another aspect of the present disclosure provides a method for fabricating a semiconductor device including providing a substrate; forming an under layer on the substrate; forming a mask layer on the under layer; forming a first protection layer on the under layer and covering the mask layer; removing a portion of the first protection layer to expose the mask layer; removing the mask layer to expose a portion of the under layer; removing a portion of the under layer using the first protection layer as a mask to form an opening exposing a portion of the substrate; performing a valley etching process to remove a portion of the substrate and form a valley on a top surface of the substrate; conformally forming programmable insulating layer on the valley; and forming a top electrode on the programmable insulating layer. The programmable insulating layer includes a V-shaped cross-sectional profile and is configured to be blown out under a programming voltage.

Due to the design of the semiconductor device of the present disclosure, the programming voltage may be reduced by employing the programmable insulating layer including the V-shaped cross-sectional profile. This reduction in programming voltage helps to prevent potential damage to other elements of the semiconductor device that may arise from high programming voltages.

The foregoing has outlined rather broadly the features and technical advantages of the present disclosure in order that the detailed description of the disclosure that follows may be better understood. Additional features and advantages of the disclosure will be described hereinafter and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1 illustrates, in a flowchart diagram form, a method for fabricating a semiconductor device in accordance with one embodiment of the present disclosure;

DETAILED DESCRIPTION

Figure 2:
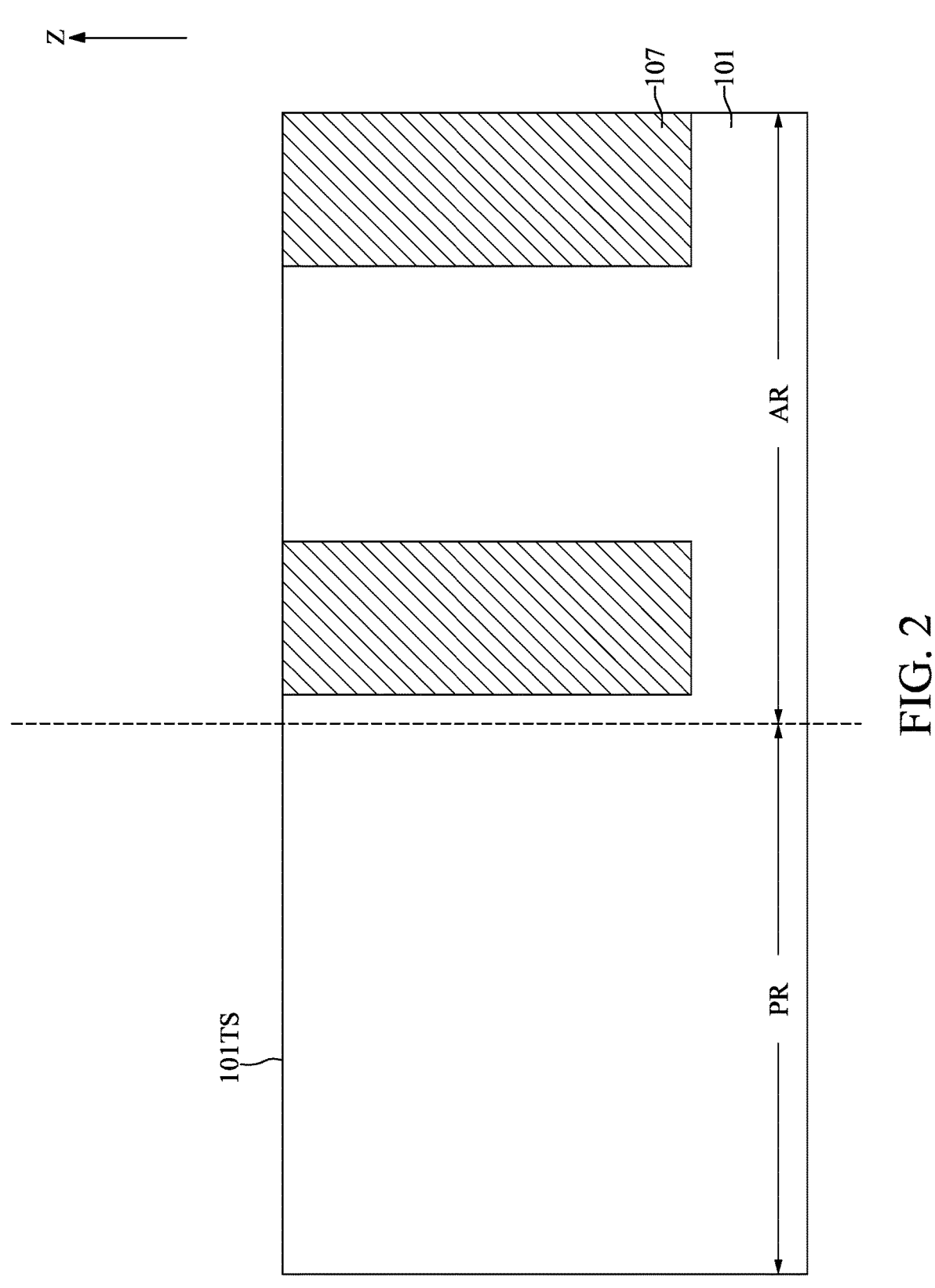
FIGS. 2 to 24 illustrate, in schematic cross-sectional view diagrams, a flow for fabricating the semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

FIG. 1 illustrates, in a flowchart diagram form, a method 10 for fabricating a semiconductor device 1A in accordance with one embodiment of the present disclosure. FIGS. 2 to 24 illustrate, in schematic cross-sectional view diagrams, a flow for fabricating the semiconductor device 1A in accordance with one embodiment of the present disclosure.

With reference to FIGS. 1 to 10, at step S11, a substrate 101 including an array region AR and a peripheral region PR may be provided and a plurality of word line structures 200 may be formed in the array region AR of the substrate 101.

With reference to FIG. 2, the substrate 101 may be a bulk semiconductor substrate. The bulk semiconductor substrate may be formed of, for example, an elementary semiconductor such as silicon or germanium or a compound semiconductor such as silicon germanium, silicon carbide, gallium arsenide, gallium phosphide, indium phosphide, indium arsenide, indium antimonide, or other III-V compound semiconductor or II-VI compound semiconductor. In some embodiments, the substrate 101 may have a crystal orientation <100>, <110>, or <111>. In some embodiments, the substrate 101 may have a crystal orientation <100> or <110>. In some embodiments, the bottom portion of the substrate 101 may be amorphous and only the top portion of the substrate 101 is single crystalline. The top portion of the substrate 101 may have a crystal orientation <100>, <110>, or <111>.

With reference to FIG. 2, an isolation layer 107 may be formed in the substrate 101. For example, the isolation layer 107 may be formed in the array region AR of the substrate 101. A series of deposition processes may be performed to deposit a pad oxide layer (not shown) and a pad nitride layer (not shown) on the substrate 101. A photolithography process and a subsequent etching process, such as an anisotropic dry etching process, may be performed to form trenches penetrating through the pad oxide layer, the pad nitride layer, and extending to the substrate 101. An insulating material may be deposited into the trenches and a planarization process, such as chemical mechanical polishing, may be subsequently performed until the top surface 101TS of the substrate 101 is exposed to remove excess filling material, provide a substantially flat surface for subsequent processing steps, and concurrently form the isolation layer 107. The insulating material may be, for example, silicon oxide or other applicable insulating materials.

Figure 3:
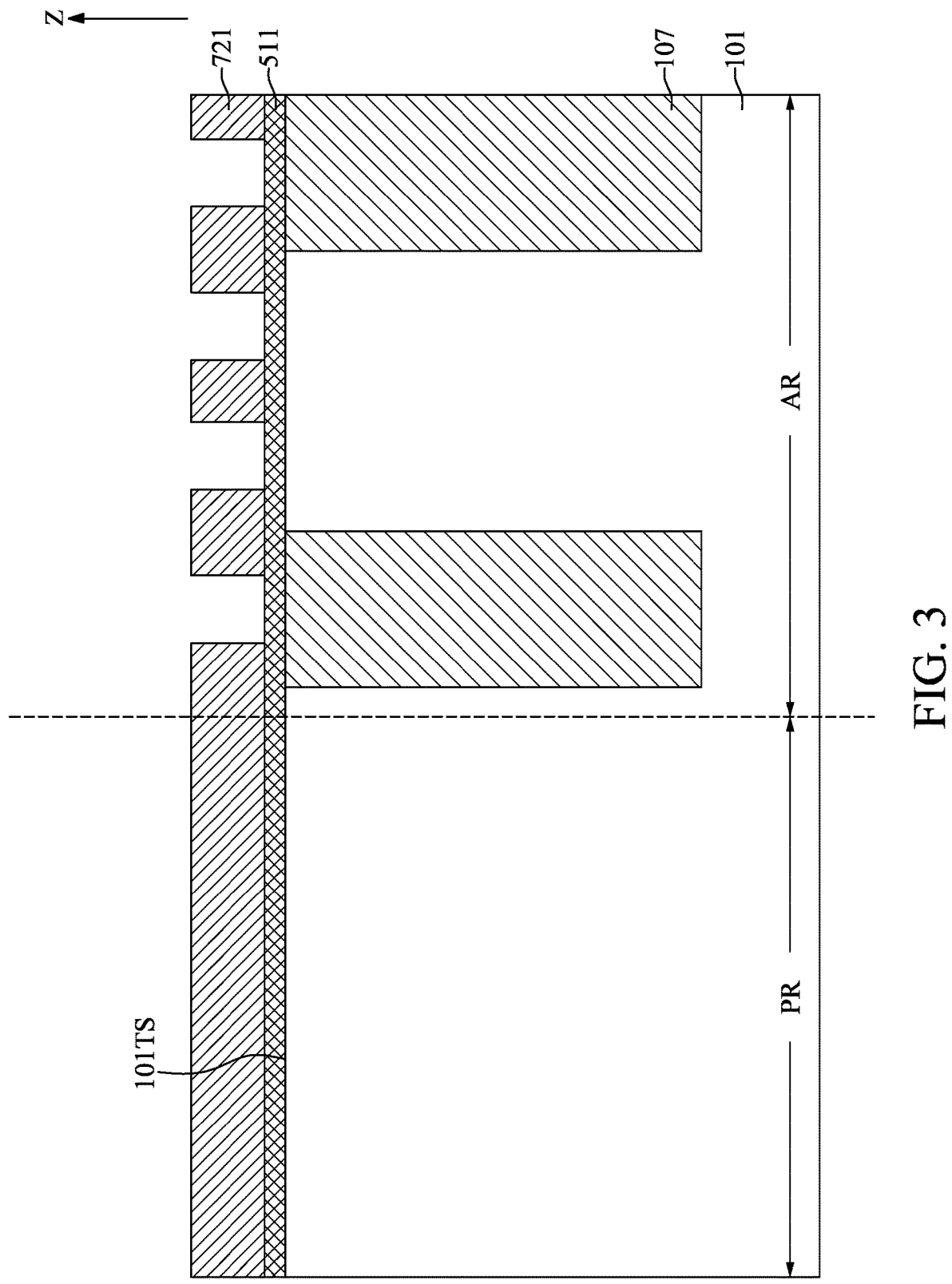

With reference to FIG. 3, a first hard mask layer 511 may be formed on the substrate 101. In some embodiments, the first hard mask layer 511 may be formed of a material having etching selectivity to the substrate 101. In some embodiments, the first hard mask layer 511 may be formed of a material having etching selectivity to the substrate 101 and the isolation layer 107. In some embodiments, the first hard mask layer 511 may be formed of, for example, silicon nitride, boron nitride, silicon boron nitride, phosphorus boron nitride, or boron carbon silicon nitride. In some embodiments, the first hard mask layer 511 may be formed by, for example, atomic layer deposition, chemical vapor deposition, or other applicable deposition processes.

In some embodiments, the first hard mask layer 511 may be formed by a film formation process and a treatment process. Detailedly, in the film formation process, first precursors, which may be boron-based precursors, may be introduced over the substrate 101 to form a boron-based layer. Subsequently, in the treatment process, second precursors, which may be nitrogen-based precursors, may be introduced to react with the boron-based layer and turn the boron-based layer into the first hard mask layer 511.

In some embodiments, the first precursors may be, for example, diborane, borazine, or an alkyl-substituted derivative of borazine. In some embodiments, the first precursors may be introduced at a flow rate between about 5 sccm and about 50 slm (standard liter per minute) or between about 10 sccm and about 1 slm. In some embodiments, the first precursors may be introduced by dilution gas such as nitrogen, hydrogen, argon, or a combination thereof. The dilution gas may be introduced at a flow rate between about 5 sccm and about 50 slm or between about 1 slm and about 10 slm.

In some embodiments, the film formation process may be performed without an assistant of plasma. In such a situation, the substrate temperature of the film formation process may be between about 100° C. and about 1000° C. For example, the substrate temperature of the film formation process may be between about 300° C. and about 500° C. The process pressure of the film formation process may be between about 10 mTorr and about 760 Torr. For example, the process pressure of the film formation process may be between about 2 Torr and about 10 Torr.

In some embodiments, the film formation process may be performed in the presence of plasma. In such a situation, the substrate temperature of the film formation process may be between about 100° C. and about 1000° C. For example, the substrate temperature of the film formation process may be between about 300° C. and about 500° C. The process pressure of the film formation process may be between about 10 mTorr and about 760 Torr. For example, the process pressure of the film formation process may be between about 2 Torr and about 10 Torr. The plasma may be generated by a RF power between 2 W and 5000 W. For example, the RF power may be between 30 W and 1000 W.

In some embodiments, the second precursors may be, for example, ammonia or hydrazine. In some embodiments, the second precursors may be introduced at a flow rate between about 5 sccm and about 50 slm or between about 10 sccm and about 1 slm.

In some embodiments, oxygen-based precursors may be introduced with the second precursors in the treatment process. The oxygen-based precursors may be, for example, oxygen, nitric oxide, nitrous oxide, carbon dioxide, or water.

In some embodiments, silicon-based precursors may be introduced with the second precursors in the treatment process. The silicon-based precursors may be, for example, silane, trisilylamine, trimethylsilane, or silazanes (e.g., hexamethylcyclotrisilazane).

In some embodiments, phosphorus-based precursors may be introduced with the second precursors in the treatment process. The phosphorus-based precursors may be, for example, phosphine.

In some embodiments, oxygen-based precursors, silicon-based precursors, or phosphorus-based precursors may be introduced with the second precursors in the treatment process.

In some embodiments, the treatment process may be performed with an assistant of a plasma process, a UV cure process, a thermal anneal process, or a combination thereof.

When the treatment is performed with the assistance of the plasma process. The plasma of the plasma process may be generated by the RF power. In some embodiments, the RF power may be between about 2 W and about 5000 W at a single low frequency of between about 100 kHz up to about 1 MHz. In some embodiments, the RF power may be between about 30 W and about 1000 W at a single high frequency greater than about 13.6 MHz. In such a situation, a substrate temperature of the treatment process may be between about 20° C. and about 1000° C. The process pressure of the treatment process may be between about 10 mTorr and about 760 Torr.

When the treatment is performed with the assistance of the UV cure process, in such a situation, the substrate temperature of the treatment process may be between about 20° C. and about 1000° C. The process pressure of the treatment process may be between about 10 mTorr and about 760 Torr. The UV cure may be provided by any UV source, such as mercury microwave arc lamps, pulsed xenon flash lamps, or high-efficiency UV light emitting diode arrays. The UV source may have a wavelength of between about 170 nm and about 400 nm. The UV source may provide a photon energy between about 0.5 eV and about 10 eV, or between about 1 eV and about 6 eV. The assistance of the UV cure process may remove hydrogen from the first hard mask layer 511. As hydrogen may diffuse through into other areas of the semiconductor device 1A and may degrade the reliability of the semiconductor device 1A, the removal of hydrogen by the assistance of UV cure process may improve the reliability of the semiconductor device 1A. In addition, the UV cure process may increase the density of the first hard mask layer 511.

When the treatment is performed with the assistant of the thermal anneal process. In such a situation, a substrate temperature of the treatment process may be between about 20° C. and about 1000° C. The process pressure of the treatment process may be between about 10 mTorr and about 760 Torr.

With reference to FIG. 3, a first mask layer 721 may be formed on the first hard mask layer 511. In some embodiments, the first mask layer 721 may be a photoresist layer and may include a pattern of the plurality of word line structures 200.

Figure 4:
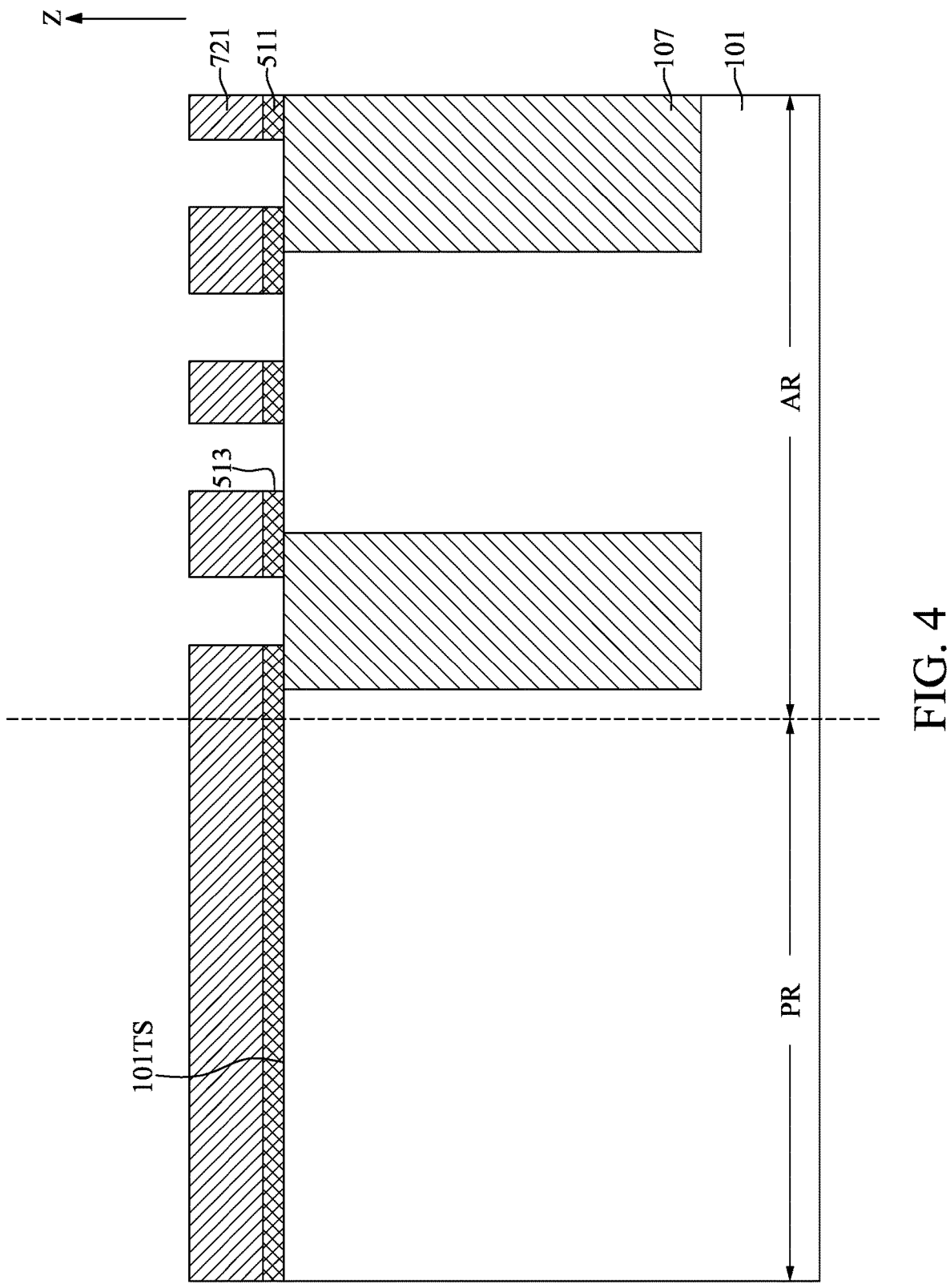

With reference to FIG. 4, an etching process may be performed to remove a portion of the first hard mask layer 511. In some embodiments, the etch rate ratio of the first hard mask layer 511 to the substrate 101 may be between about 100:1 and about 2:1, between about 15:1 and about 2:1, or between about 10:1 and about 2:1 during the etching process. In some embodiments, the etch rate ratio of the first hard mask layer 511 to the isolation layer 107 may be between about 100:1 and about 2:1, between about 15:1 and about 2:1, or between about 10:1 and about 2:1 during the etching process. The pattern of the first mask layer 721 may be transferred to the first hard mask layer 511 and may be referred to as the first pattern 513. Portions of the isolation layer 107 and portions of the substrate 101 may be exposed through the first pattern 513. After the etching process, the first mask layer 721 may be removed by ashing or other applicable processes.

Figure 5:
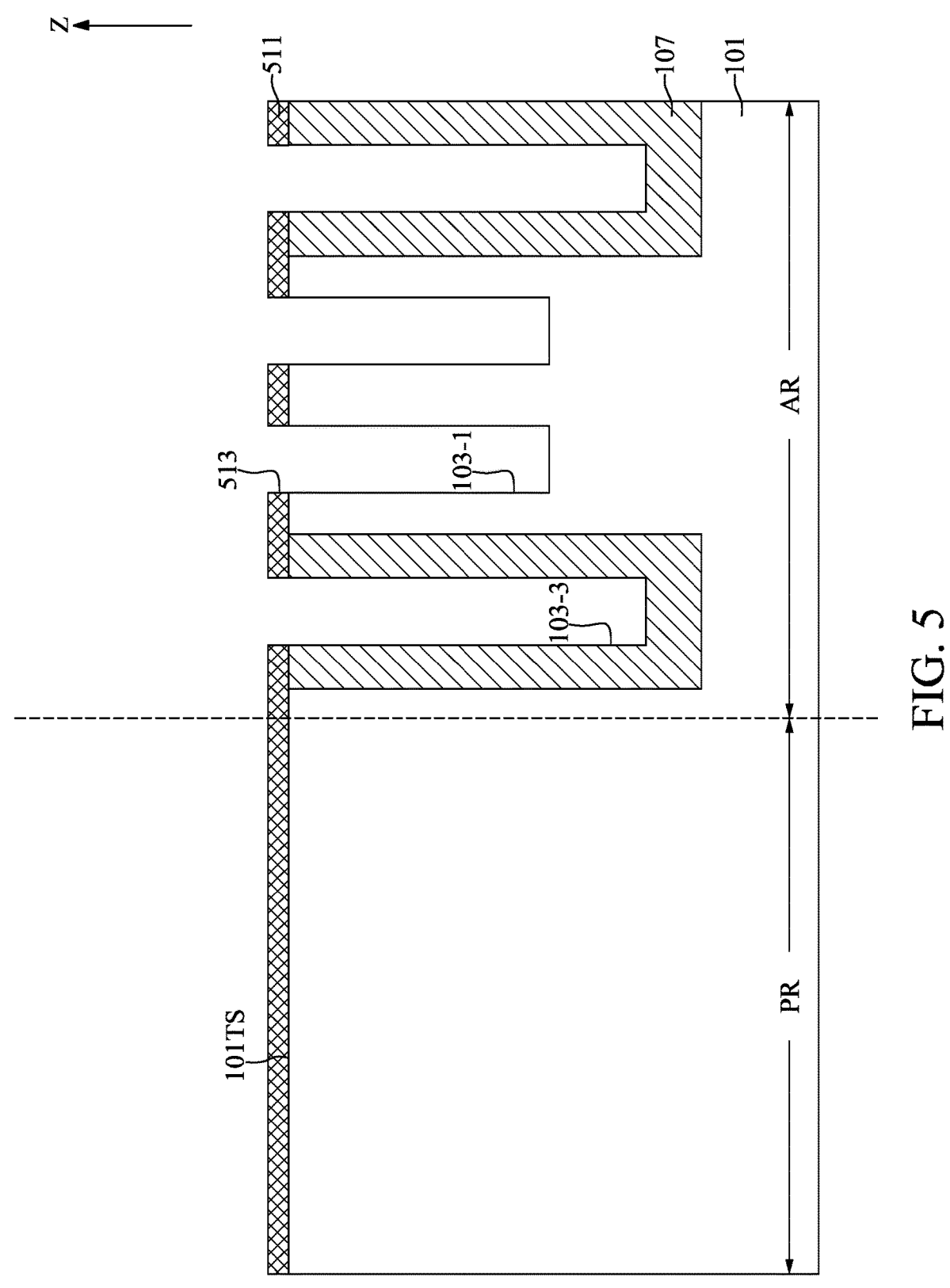

With reference to FIG. 5, a trench etching process may be performed using the first hard mask layer 511 as a mask to remove portions of the isolation layer 107 and portions of the substrate 101 and concurrently form a plurality of word line trenches 103-1, 103-3. In some embodiments, the plurality of word line trenches 103-1 formed in the substrate 101 may be shallower than the plurality of word line trenches 103-3 formed in the isolation layer 107. In some embodiments, the etch rate ratio of the isolation layer 107 to the first hard mask layer 511 may be between about 100:1 and about 5:1, between about 15:1 and about 5:1, or between about 10:1 and about 5:1 during the trench etching process. In some embodiments, the etch rate ratio of the substrate 101 to the first hard mask layer 511 may be between about 80:1 and about 5:1, between about 10:1 and about 5:1, or between about 8:1 and about 5:1 during the trench etching process.

Figure 6:
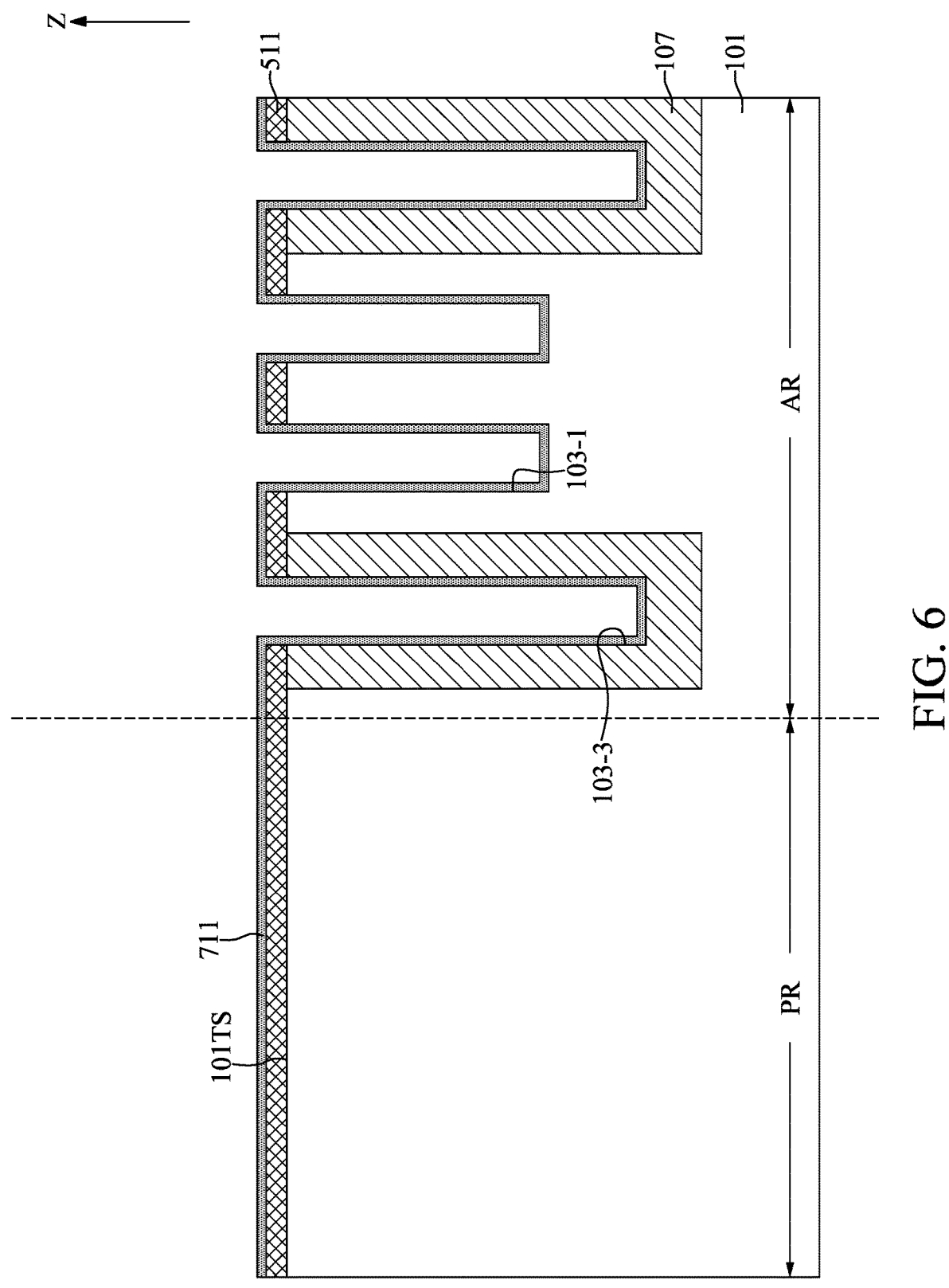

With reference to FIG. 6, a layer of first insulating material 711 may be conformally formed on the first hard mask layer 511 and in the plurality of word line trenches 103-1, 103-3. The layer of first insulating material 711 may have a U-shaped cross-sectional profile in the plurality of word line trenches 103-1, 103-3. In some embodiments, the layer of first insulating material 711 may have a thickness in a range of about 1 nm to about 7 nm, including about 1 nm, about 2 nm, about 3 nm, about 4 nm, about 5 nm, about 6 nm, or about 7 nm.

In some embodiments, the layer of first insulating material 711 may be formed by a thermal oxidation process. For example, the layer of first insulating material 711 may be formed by oxidizing the surface of the plurality of word line trenches 103-1, 103-3. In some embodiments, the layer of first insulating material 711 may be formed by a deposition process such as a chemical vapor deposition or an atomic layer deposition. The first insulating material 711 may include a high-k material, an oxide, a nitride, an oxynitride or combinations thereof. In some embodiments, after a liner polysilicon layer (not shown for clarity) is deposited, the layer of first insulating material 711 may be formed by radical-oxidizing the liner polysilicon layer. In some embodiments, after a liner silicon nitride layer (not shown for clarity) is formed, the layer of first insulating material 711 may be formed by radical-oxidizing the liner silicon nitride layer.

In some embodiments, the high-k dielectric material may include a hafnium-containing material. The hafnium-containing material may be, for example, hafnium oxide, hafnium silicon oxide, hafnium silicon oxynitride, or a combination thereof. In some embodiments, the high-k dielectric material may be, for example, lanthanum oxide, lanthanum aluminum oxide, zirconium oxide, zirconium silicon oxide, zirconium silicon oxynitride, aluminum oxide or a combination thereof.

Figure 7:
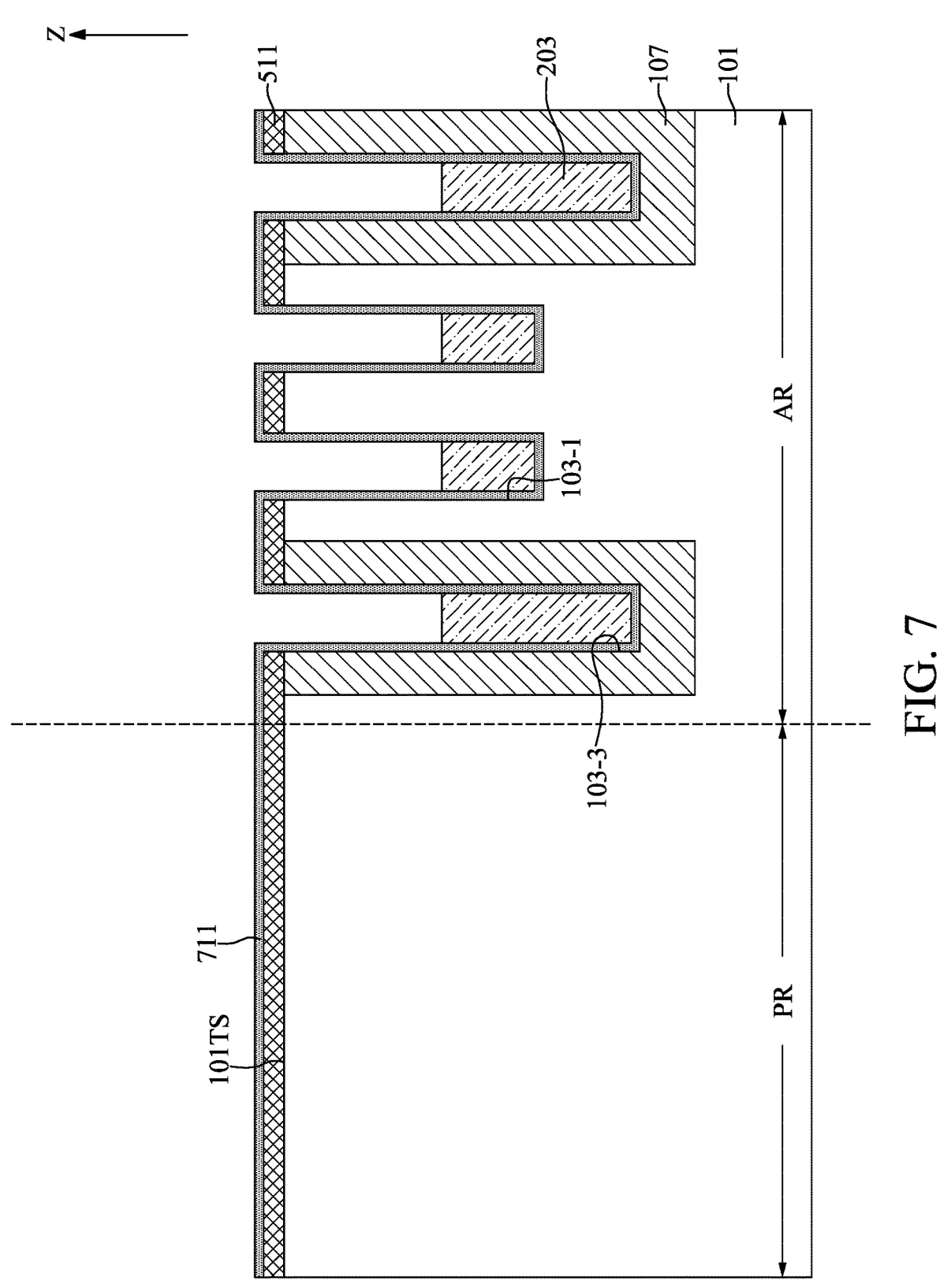

With reference to FIG. 7, a plurality of word line bottom conductive layers 203 may be formed in the plurality of word line trenches 103-1, 103-3, respectively and correspondingly. For example, a conductive material (not shown) may be formed to fill the plurality of word line trenches 103-1, 103-3. An etching back process may be subsequently performed to partially remove the conductive material formed in the plurality of word line trenches 103-1, 103-3 and concurrently form the plurality of word line bottom conductive layers 203. In some embodiments, the conductive material may be a work function material such as, titanium, titanium nitride, silicon, silicon germanium, or a combination thereof. It should be noted that the term "work function" refers to the bulk chemical potential of a material (e.g., metal) relative to the vacuum level.

For example, in the present embodiment, the conductive material is titanium nitride and may be formed by chemical vapor deposition. In some embodiments, the deposition of the conductive material may include a source gas introducing step, a first purging step, a reactant flowing step, and a second purging step. The source gas introducing step, the first purging step, the reactant flowing step, and the second purging step may be referred to as one cycle. Multiple cycles may be performed to fill the plurality of word line trenches 103-1, 103-3.

Detailedly, the intermediate semiconductor device illustrated in FIG. 6 may be loaded in a reaction chamber. In the source gas introducing step, source gases containing a precursor and a reactant may be introduced to the reaction chamber containing the intermediate semiconductor device. The precursor and the reactant may diffuse across the boundary layer and reach the surface of the intermediate semiconductor device. The precursor and the reactant may adsorb on and subsequently migrate on the surface aforementioned. The adsorbed precursor and the adsorbed reactant may react on the surface aforementioned and form solid byproducts. The solid byproducts may form nuclei on the surface aforementioned. The nuclei may grow into islands and the islands may merge into a continuous thin film on the surface aforementioned. In the first purging step, a purge gas such as argon may be injected into the reaction chamber to purge out the gaseous byproducts, unreacted precursor, and unreacted reactant.

In the reactant flowing step, the reactant may be solely introduced to the reaction chamber to turn the continuous thin film into a titanium nitride layer. In the second purging step, a purge gas such as argon may be injected into the reaction chamber to purge out the gaseous byproducts and unreacted reactant.

In some embodiments, the deposition of the conductive material using chemical vapor deposition may be performed with the assistance of plasma. The source of the plasma may be, for example, argon, hydrogen, or a combination thereof.

For example, the precursor may be titanium tetrachloride. The reactant may be ammonia. Titanium tetrachloride and ammonia may react on the surface and form a titanium nitride layer including high chloride contamination due to incomplete reaction between titanium tetrachloride and ammonia. The ammonia in the reactant flowing step may reduce the chloride content of the titanium nitride layer.

In some embodiments, the etch rate ratio of the word line bottom conductive layer 203 to the first insulating material 711 may be between about 100:1 and about 5:1, between about 15:1 and about 5:1, or between about 10:1 and about 5:1 during the etching back process.

Figure 8:
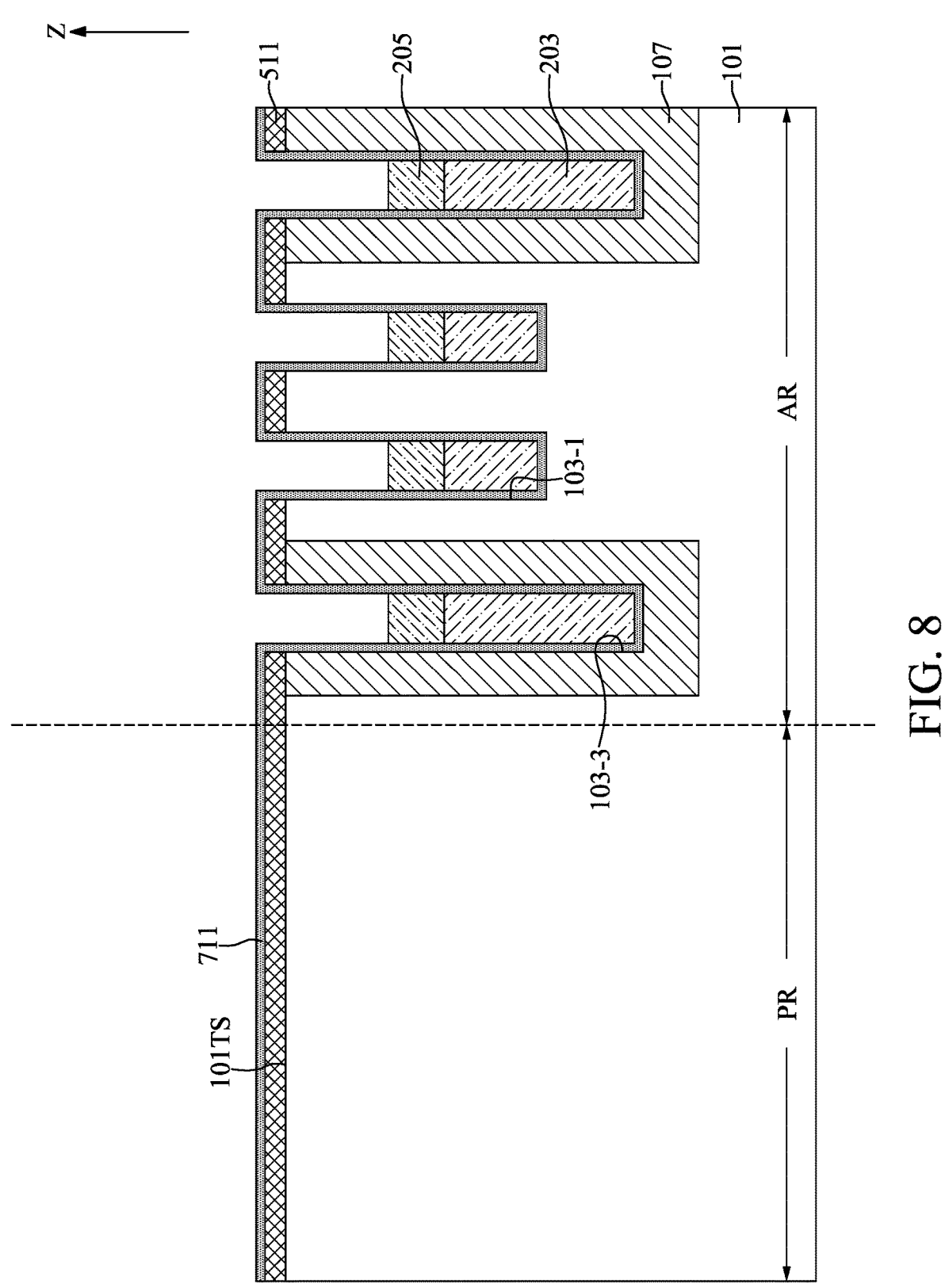

With reference to FIG. 8, a plurality of word line top conductive layers 205 may be formed in the plurality of word line trenches 103-1, 103-3. In some embodiments, the plurality of word line top conductive layers 205 may be formed of, for example, polycrystalline silicon, polycrystalline germanium, polycrystalline silicon germanium, doped polycrystalline silicon, doped polycrystalline germanium, doped polycrystalline silicon germanium, or a combination thereof. In some embodiments, the plurality of word line top conductive layers 205 may be doped with p-type dopants or n-type dopants. In some embodiments, a conductive material such as polycrystalline silicon, polycrystalline germanium, or polycrystalline silicon germanium may be deposited into the plurality of word line trenches 103-1, 103-3. An etching back process may be subsequently performed to remove portions of the conductive to form the plurality of word line top conductive layers 205. In some embodiments, the dopants may be incorporated into the deposition process of the conductive material. In some embodiments, the dopants may be doped using an implantation process after the etching back process.

The term "p-type dopant" refers to an impurity that when added to an intrinsic semiconductor material creates deficiencies of valence electrons. In a silicon containing semiconductor material, examples of p-type dopants include, but are not limited to, boron, aluminum, gallium or indium. The term "n-type dopant" refers to an impurity that when added to an intrinsic semiconductor material contributes free electrons to the intrinsic semiconductor material. In a silicon-containing material, examples of n-type dopants include, but are not limited to, antimony, arsenic or phosphorus.

Figure 9:
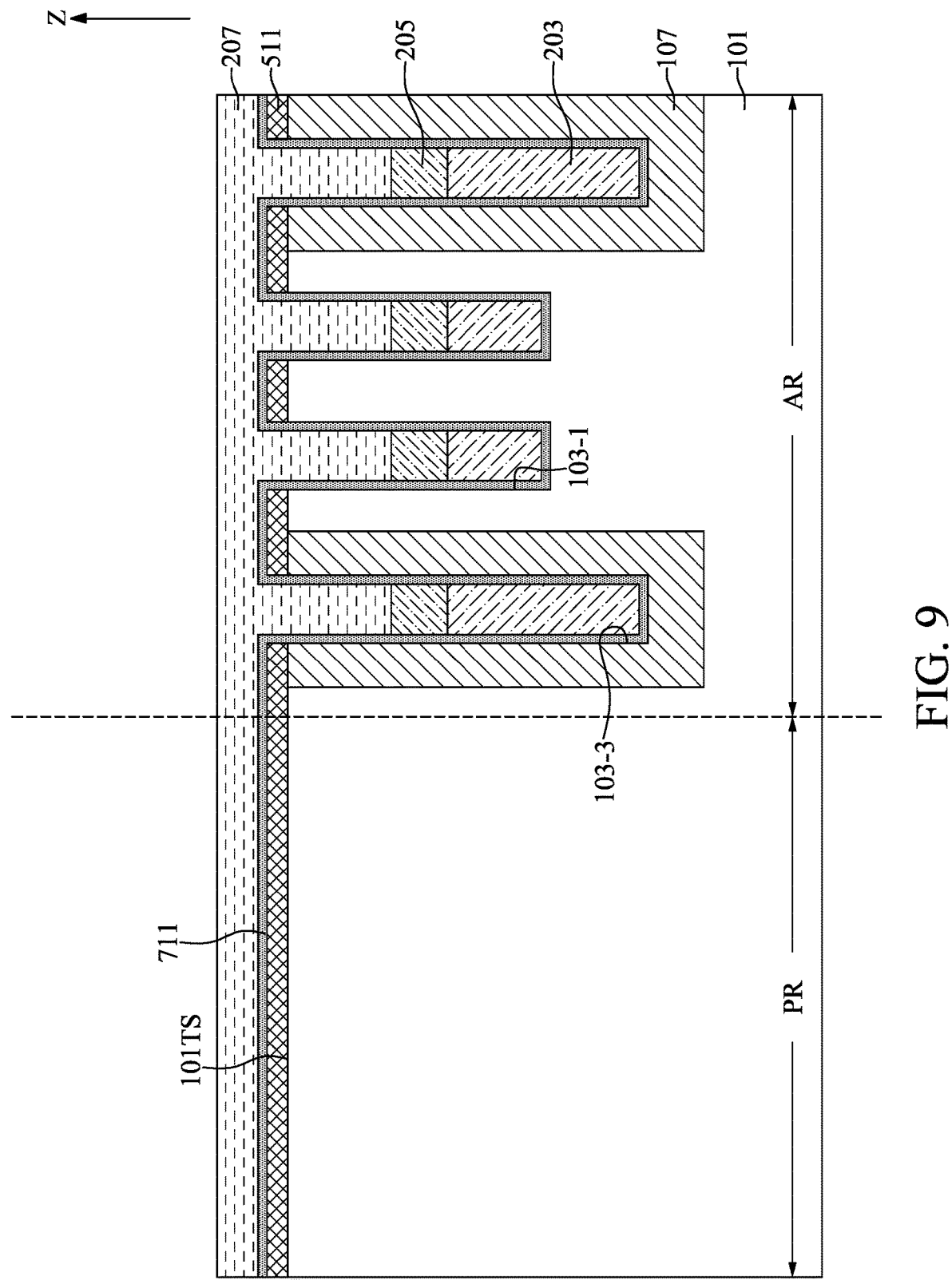

With reference to FIG. 9, a word line capping layer 207 may be formed on the first hard mask layer 511 to completely fill the plurality of word line trenches 103-1, 103-3. In some embodiments, the word line capping layer 207 may be formed of, for example, silicon nitride, silicon oxynitride, silicon nitride oxide, or other applicable dielectric material. In some embodiments, the word line capping layer 207 may be formed by, for example, chemical vapor deposition, plasma-enhanced chemical vapor deposition, or other applicable deposition processes. A planarization process, such as chemical mechanical polishing, may be performed to remove excess material and provide a substantially flat surface for subsequent processing steps.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

Figure 10:
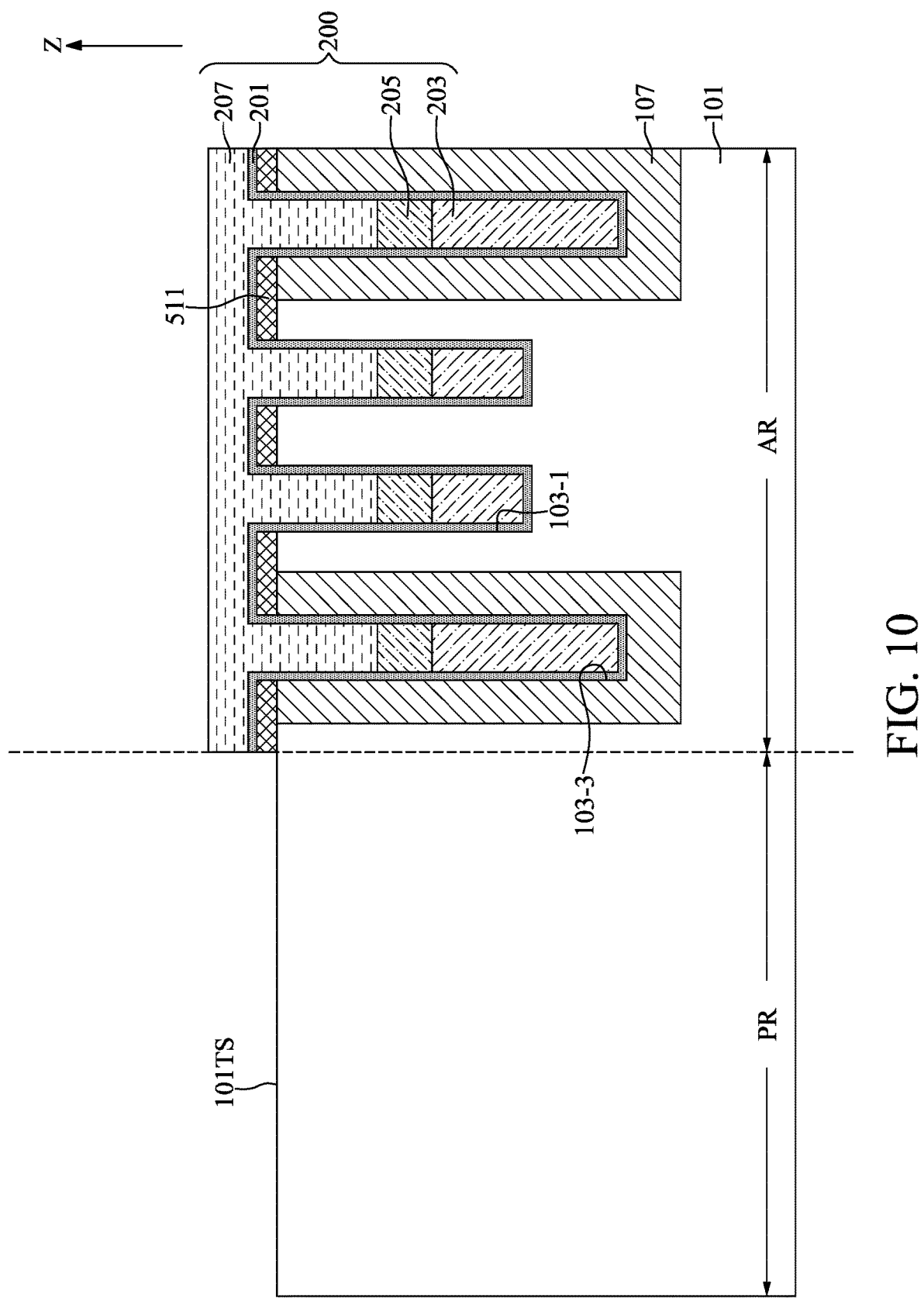

With reference to FIG. 10, a mask layer (not shown for clarity) may be formed over the array region AR of the substrate 101 to cover the word line capping layer 207 formed over the array region AR of the substrate 101. An etching process may be performed to remove the word line capping layer 207, the layer of first insulating material 711, and the first hard mask layer 511 formed over the array region AR of the substrate 101. The remaining first insulating material 711 may be referred to as the word line dielectric layer 201. The word line dielectric layer 201, the plurality of word line bottom conductive layers 203, the plurality of word line top conductive layers 205, and the word line capping layer 207 together configure the plurality of word line structures 200.

With reference to FIG. 1 and FIGS. 11 to 16, at step S13, an under layer 531 may be formed over the substrate 101, a first protection layer 521 may be formed on the under layer 531, and a plurality of openings 523 may be formed to expose portions of the peripheral region PR of the substrate 101.

Figure 11:
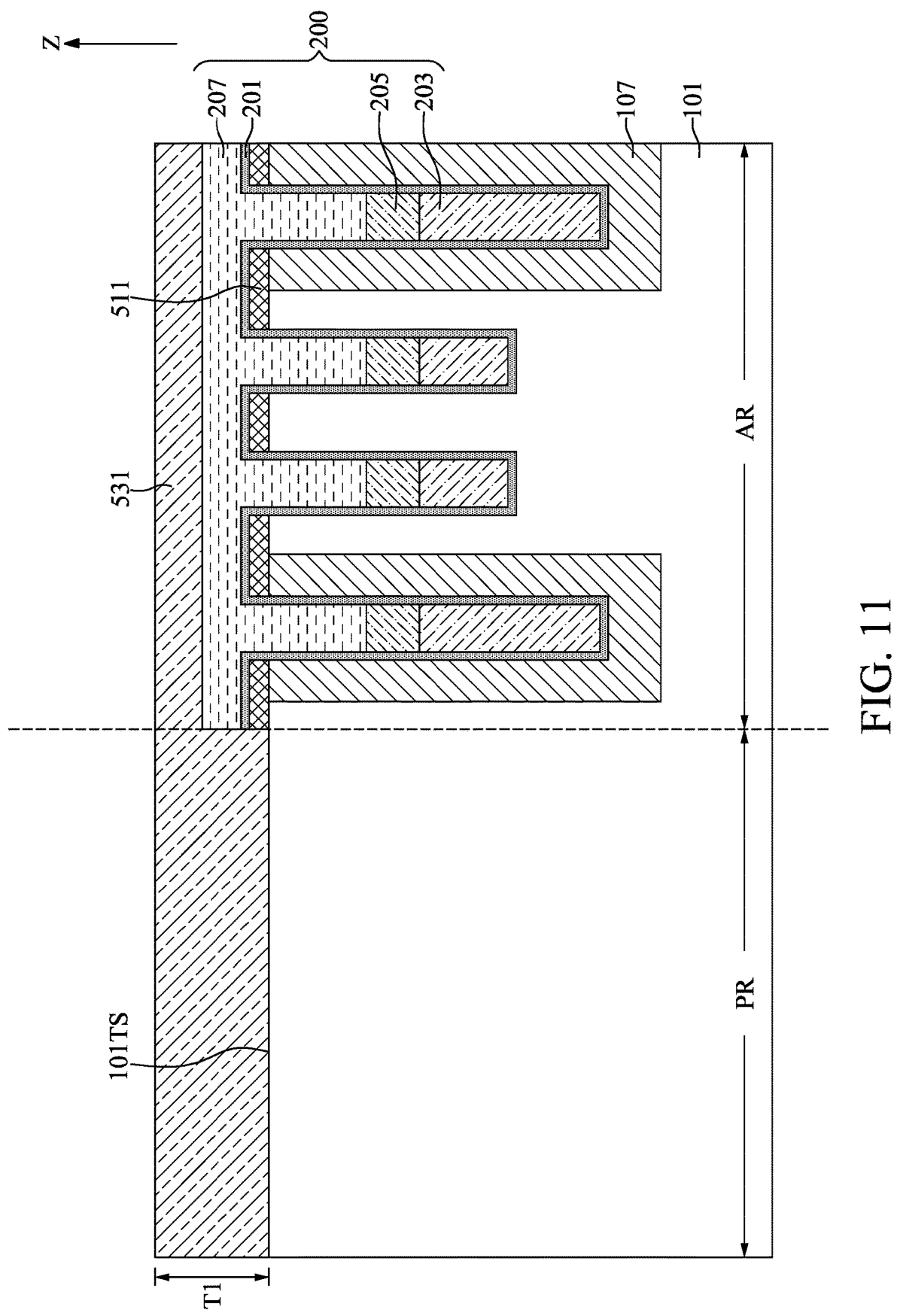

With reference to FIG. 11, the under layer 531 may be formed on the word line capping layer 207 and on the peripheral region PR of the substrate 101. In some embodiments, a planarization process may be performed to remove excess material and provide a substantially flat surface for subsequent processing steps. In some embodiments, the under layer 531 may include a self-planarizing material such as a spin-on glass or a spin-on low-k dielectric material. The use of a self-planarizing dielectric material may avoid the need to perform a subsequent planarizing step. In some embodiments, the under layer 531 may be configured as an anti-reflective layer. In some embodiments, the under layer 531 may consist of thin film structures with alternating layers of contrasting refractive index. The thickness T1 of the under layer 531 may be chosen to produce destructive interference in the beams reflected from the interfaces, and constructive interference in the corresponding transmitted beams. By way of example, and by no means limiting, the under layer 531 may be formed of, for example, oxides, sulfides, fluorides, nitrides, selenides, or a combination thereof. In some embodiments, the under layer 531 may improve the resolution of the lithography process. In some embodiments, the under layer 531 may be formed by a deposition process including, for example, chemical vapor deposition, plasma enhanced chemical vapor deposition, evaporation, spin-on coating, or other applicable deposition processes.

Figure 12:
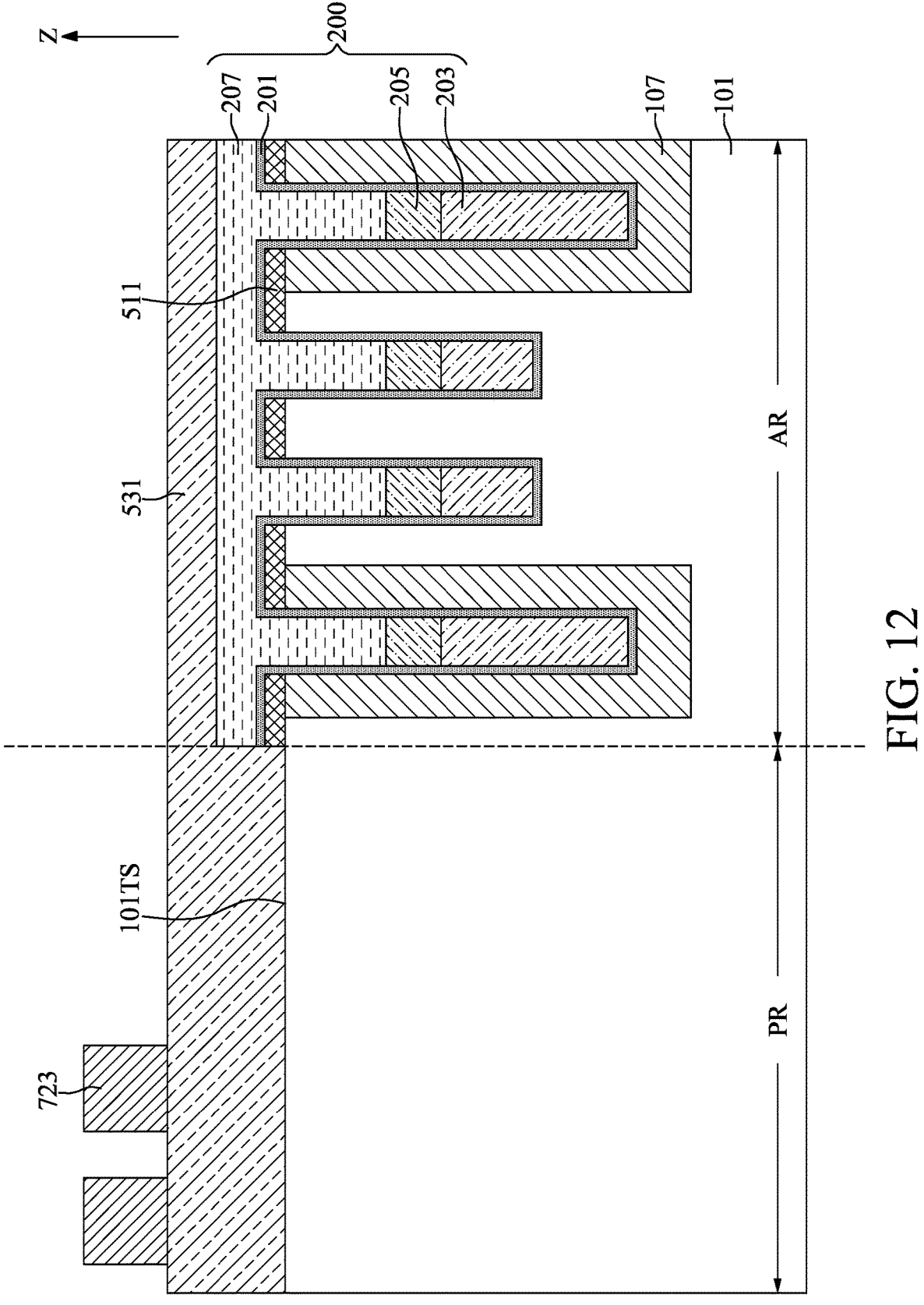

With reference to FIG. 12, a second mask layer 723 may be formed on the under layer 531. The second mask layer 723 may only be formed over the peripheral region PR of the substrate 101. In some embodiments, the second mask layer 723 may be a photoresist layer and may include a pattern of a plurality of programmable insulating layers 401 which will be illustrated later.

Figure 13:
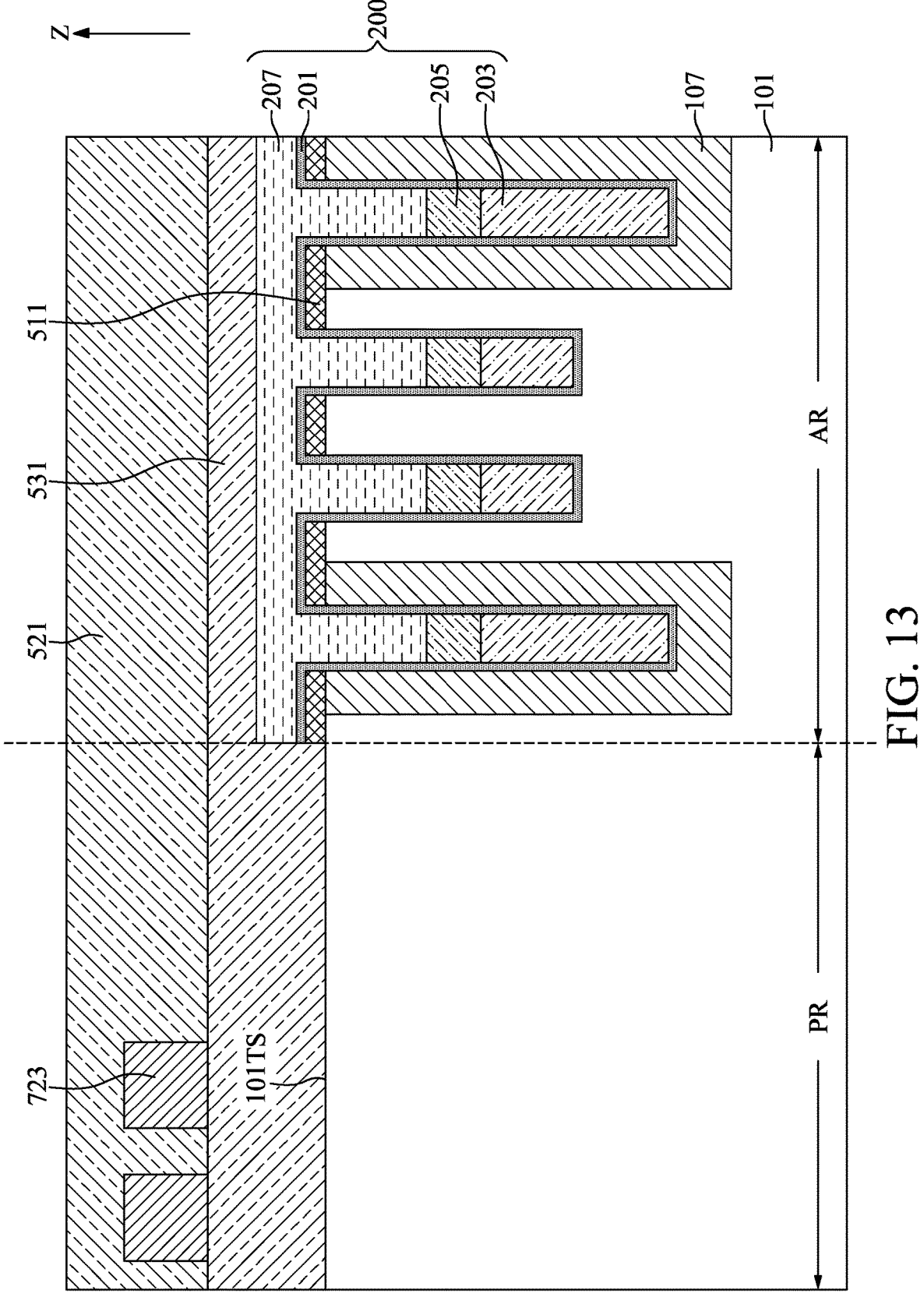

With reference to FIG. 13, a first protection layer 521 may be formed to cover the under layer 531 and the second mask layer 723. In some embodiments, the first protection layer 521 may be formed of a material having etching selectivity to the under layer 531. In some embodiments, the first protection layer 521 may be configured as a protection layer for the under layer 531 for the subsequent semiconductor processes. In some embodiments, the first protection layer 521 may be formed of, for example, oxide. In some embodiments, the first protection layer 521 may be a carbon film. The term "carbon film" is used herein to describe materials whose mass is primarily carbon, whose structure is defined primarily by carbon atoms, or whose physical and chemical properties are dominated by its carbon content. The term "carbon film" is meant to exclude materials that are simply mixtures or compounds that include carbon, for example dielectric materials such as carbon-doped silicon oxynitride, carbon-doped silicon oxide or carbon-doped polysilicon. In some embodiments, the first protection layer 521 may be composed of carbon and hydrogen. In some embodiments, the first protection layer 521 may be composed of carbon, hydrogen, and oxygen. In some embodiments, the first protection layer 521 may be composed of carbon, hydrogen, and fluorine.

In some embodiments, the carbon film may be deposited by a process including introducing a processing gas mixture, consisting of one or more hydrocarbon compounds, into a processing chamber. The hydrocarbon compound has a formula $C_xH_y$, where x has a range of between 2 and 4 and y has a range of between 2 and 10. The hydrocarbon compounds may be, for example, propylene, propyne, propane, butane, butylene, butadiene, or acetylene, or a combination thereof.

In some embodiments, the first protection layer 521 may be formed with fluorine doping by adding a source of fluorine during the high-density plasma chemical vapor deposition process. The source of fluorine may be, for example, octafluorocyclobutane, tetrafluoromethane, hexafluoroethane, octafluoropropane, trifluoromethane, hexafluorobenzene, or a combination thereof. The flow rate of the source of fluorine may be between slightly greater 0 and about 150 sccm. The flow rate ratio of the source of fluorine to the source of carbon is important for the doping level and thermal stability of the first protection layer 521. For an unbiased process situation, the flow rate ratio of the source of fluorine to the source of carbon may be between about 0.2 and about 2. For a biased process situation, the flow rate ratio of the source of fluorine to the source of carbon may be between about 0.7 and about 1.3.

In some embodiments, an annealing process may be performed after the high-density plasma chemical vapor deposition process to enhance the thermal stability of the first protection layer 521. The annealing process may be carried out in vacuum, or in an inert atmosphere composed of gasses such as argon or nitrogen, at a temperature between about 300° C. and about 450° C. for approximately 30 minutes.

The thickness and uniformity of the first protection layer 521 formed by the high-density plasma chemical vapor deposition process may be well controlled. For example, the standard deviation of the thickness of the first protection layer 521 may be less than 4%. In addition, the first protection layer 521 formed by the high-density plasma chemical vapor deposition process may be thermally stable at elevated temperatures up to approximately 400° C. Thermal stability means that the first protection layer 521 will not suffer from weight loss, deformation or chemical reactions when exposed to etch environments at temperatures between about 200° C. and about 400° C. The thermal stability of the first protection layer 521 at elevated temperatures, will allow for its use as a mask for etch operations that are performed at temperatures higher than 200° C. Furthermore, the etch resistance property of the first protection layer 521 may be tuned by adjusting the doping level of fluorine. The etch resistive property of the first protection layer 521 may be decreased with higher doping level of fluorine.

Figure 14:
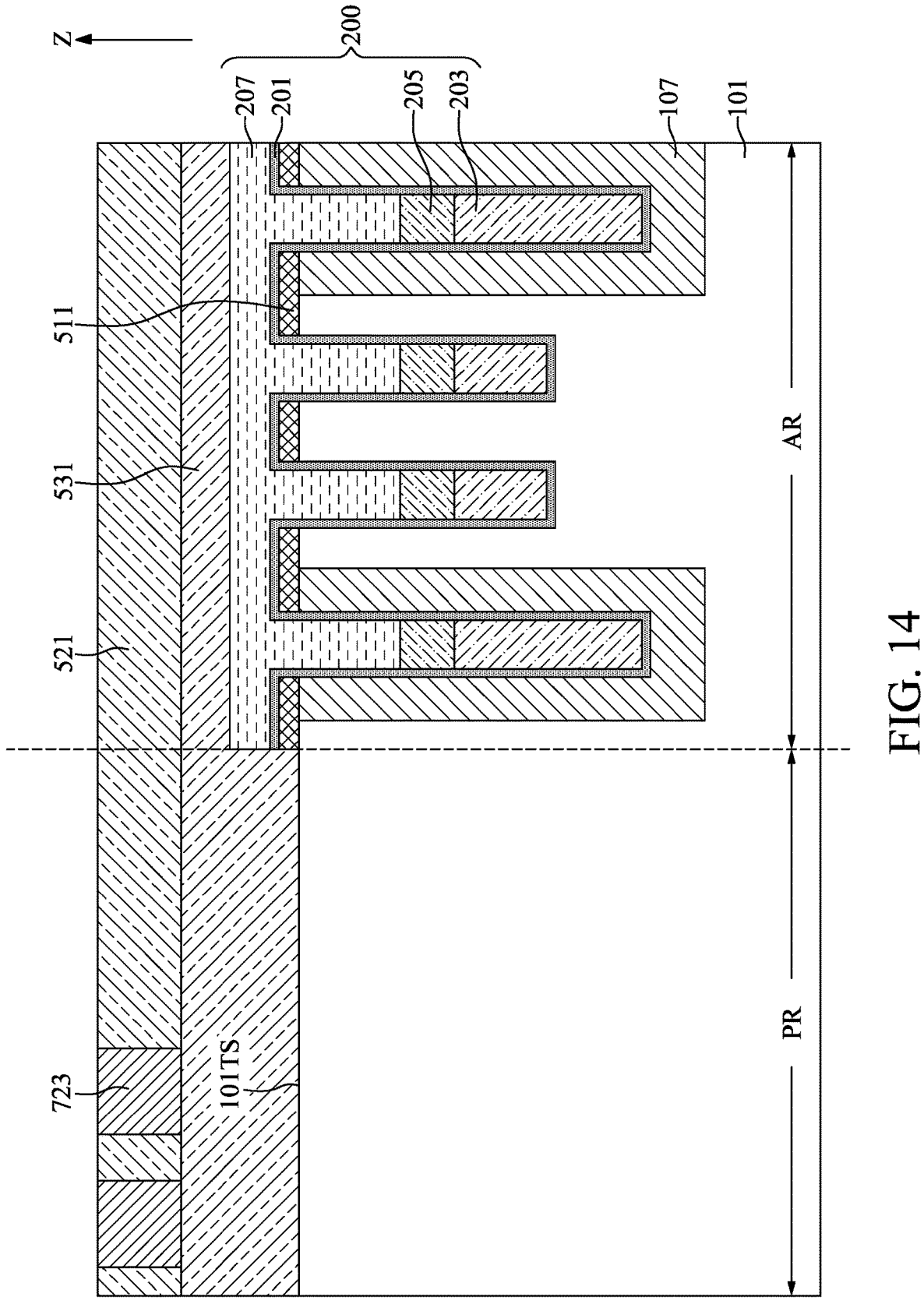

With reference to FIG. 14, a recessing process may be performed to reduce the thickness of the first protection layer 521. In some embodiments, the recessing process may include an etching process, a planarization process, or a combination thereof. After the recessing process, the second mask layer 723 may be exposed.

Figure 15:
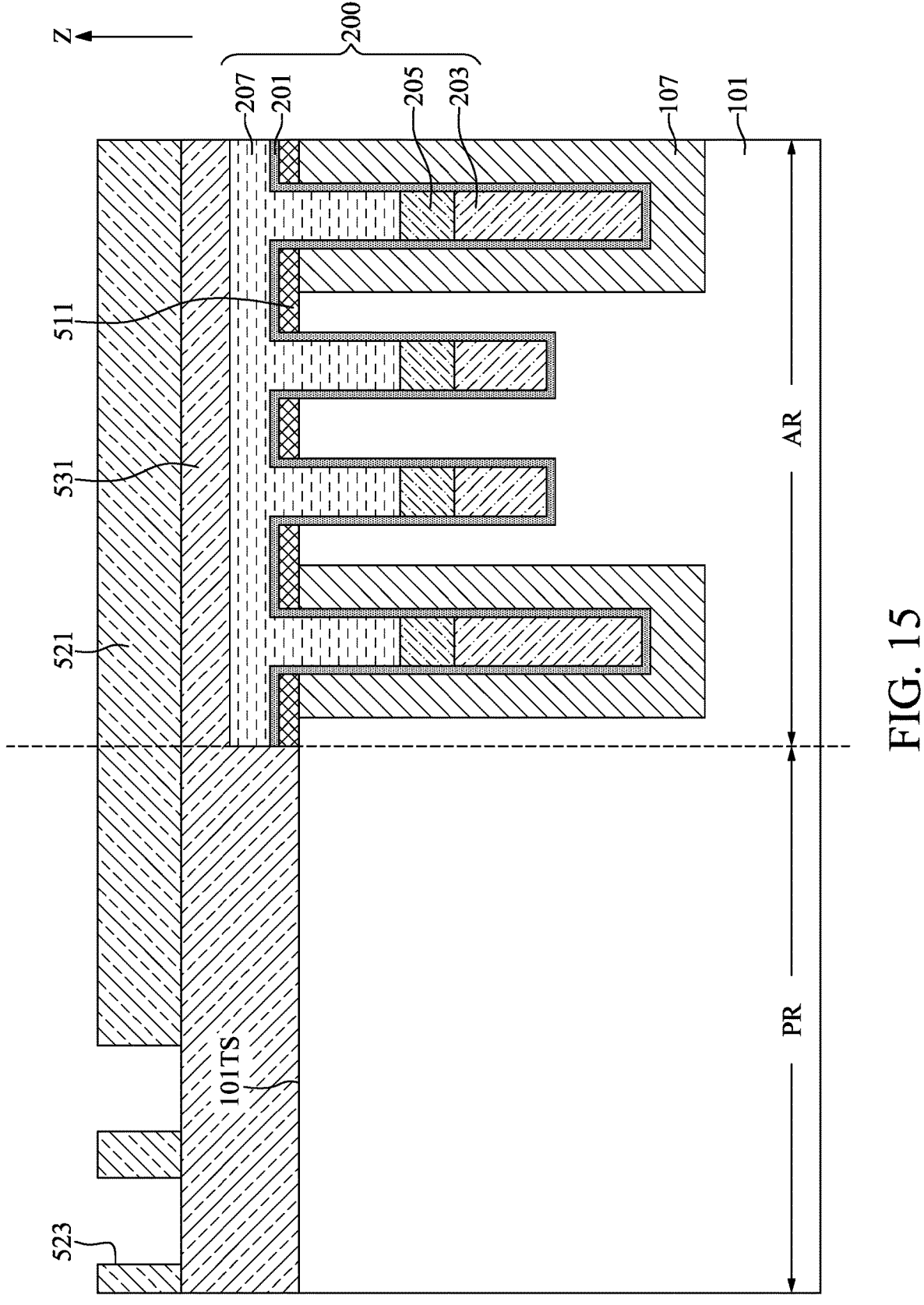

With reference to FIG. 15, the second mask layer 723 may be removed through an ashing process or other applicable semiconductor processes. The mask layer (not shown) covering the array region AR of the substrate 101 may also be removed through the ashing process. After the removal of the second mask layer 723, the plurality of openings 523 may be formed along the first protection layer 521 to expose a portion of the under layer 531 above the peripheral region PR of the substrate 101.

Figure 16:
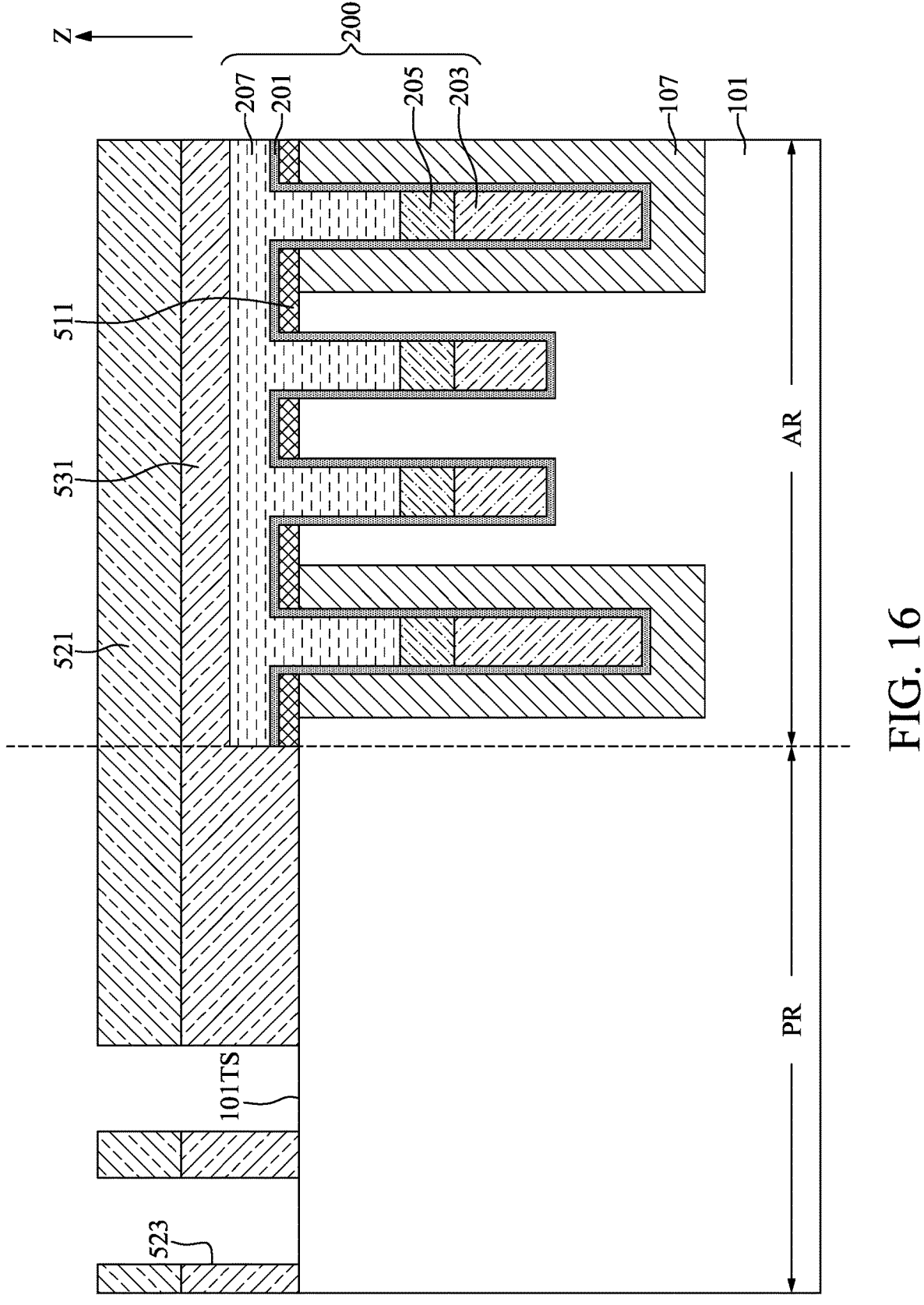

With reference to FIG. 16, an etching process may be performed using the first protection layer 521 as a mask layer to remove portions of the under layer 531. The etching process may extend the plurality of openings 523 to the under layer 531. Portions of the top surface 101TS of the peripheral region PR of the substrate 101 may be exposed through the plurality of openings 523.

Figure 17:
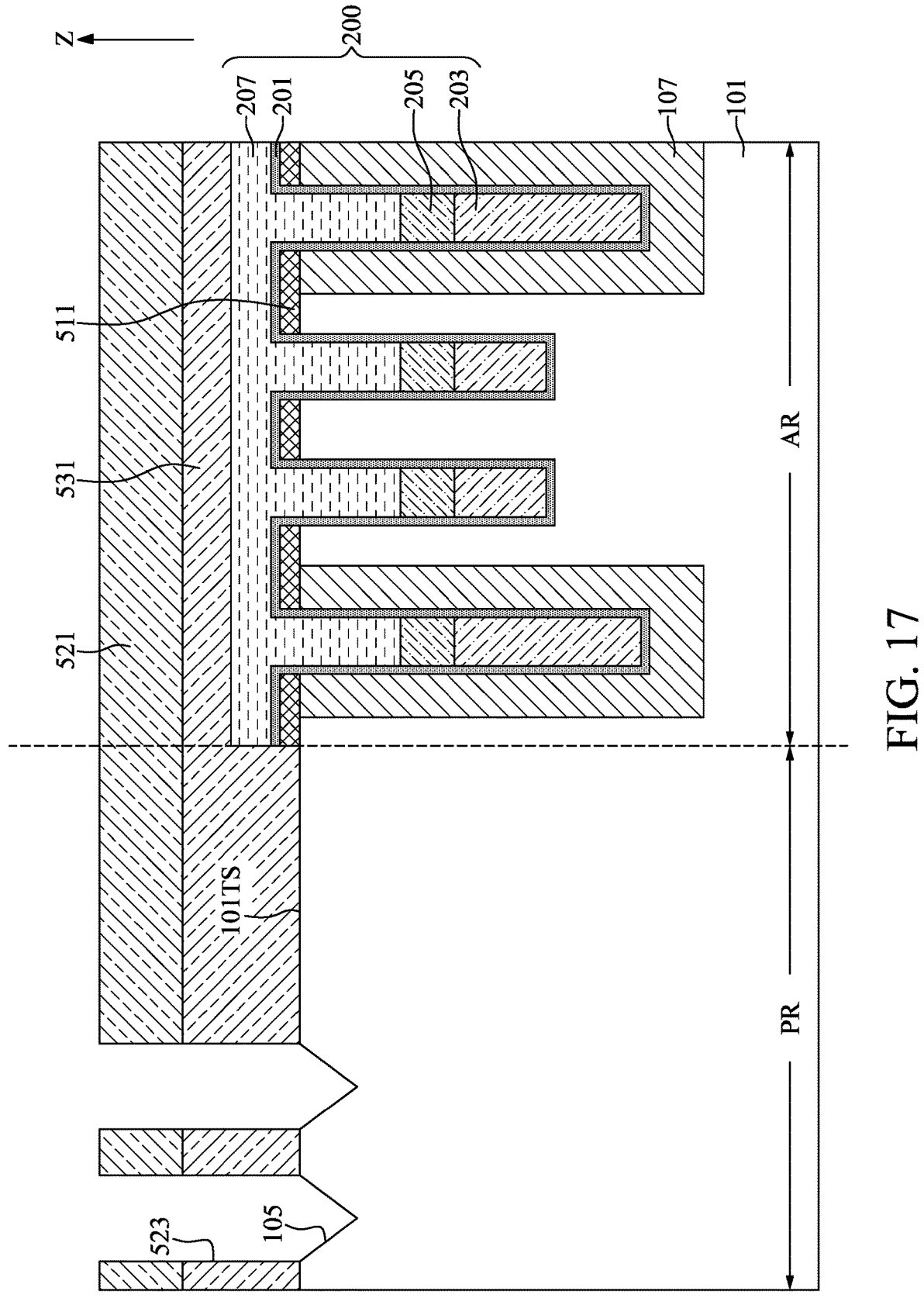
Figure 18:
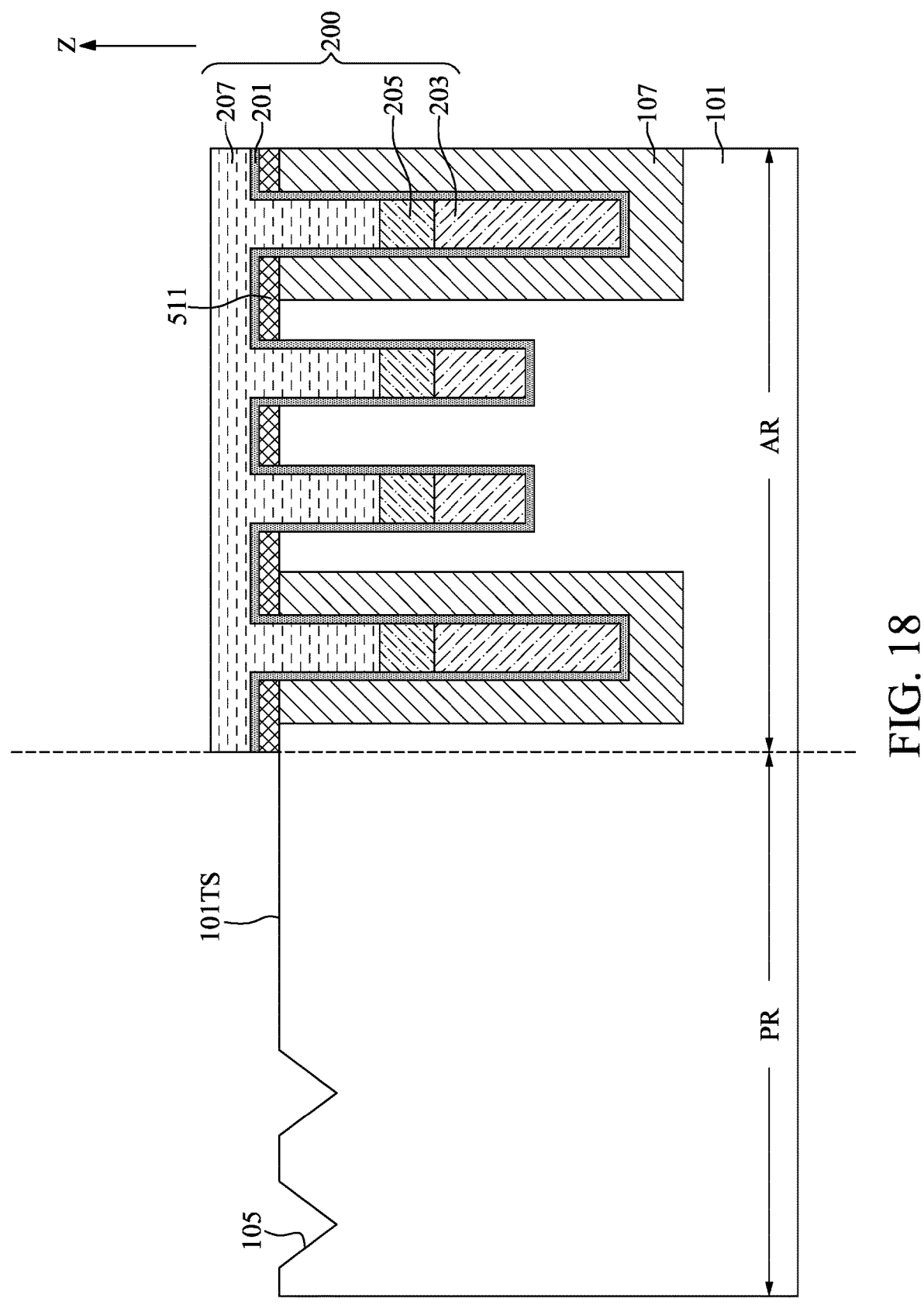

With reference to FIGS. 1, 17, and 18, at step S15, a valley etching process may be performed to form a plurality of valleys 105 on the peripheral region PR of the substrate 101.

With reference to FIG. 17, in some embodiments, the valley etching process may be a wet etching process. In some embodiments, the valley etching process may include etchants such as potassium hydroxide or sodium hydroxide. In some embodiments, when the substrate 101 includes the crystal orientation <110>, the valley etching process may be performed with potassium hydroxide, isopropyl alcohol, and water in a temperature between about 80° C. to 82° C. In some embodiments, when the substrate 101 includes the crystal orientation <100>, the valley etching process may be performed with sodium hydroxide. After the valley etching process, the plurality of valleys 105 may be formed on the top surface 101TS of the peripheral region PR of the substrate 101. The plurality of valleys 105 may include a V-shaped cross-sectional profile. In some embodiments, the plurality of valleys 105 may be referred to as valley-shaped recesses or valley-shaped trenches. In some embodiments, the valleys 105 may include a crystal orientation <111>.

With reference to FIG. 18, the first protection layer 521 and the under layer 531 may be removed by a removal process. In some embodiments, the removal rate ratio of the first protection layer 521 to the substrate 101 may be between about 100:1 and about 5:1, between about 15:1 and about 5:1, or between about 10:1 and about 5:1 during the removal process. In some embodiments, the removal rate ratio of the under layer 531 to the substrate 101 may be between about 100:1 and about 5:1, between about 15:1 and about 5:1, or between about 10:1 and about 5:1 during the removal process.

With reference to FIG. 1 and FIGS. 19 to 24, at step S17, a plurality of programmable insulating layers 401 may be formed on the plurality of valleys 105, a plurality of programmable top electrodes 403 may be formed on the plurality of programmable insulating layers 401, and a plurality of peripheral gate structures 300 may be formed on the peripheral region PR of the substrate 101.

Figure 19:
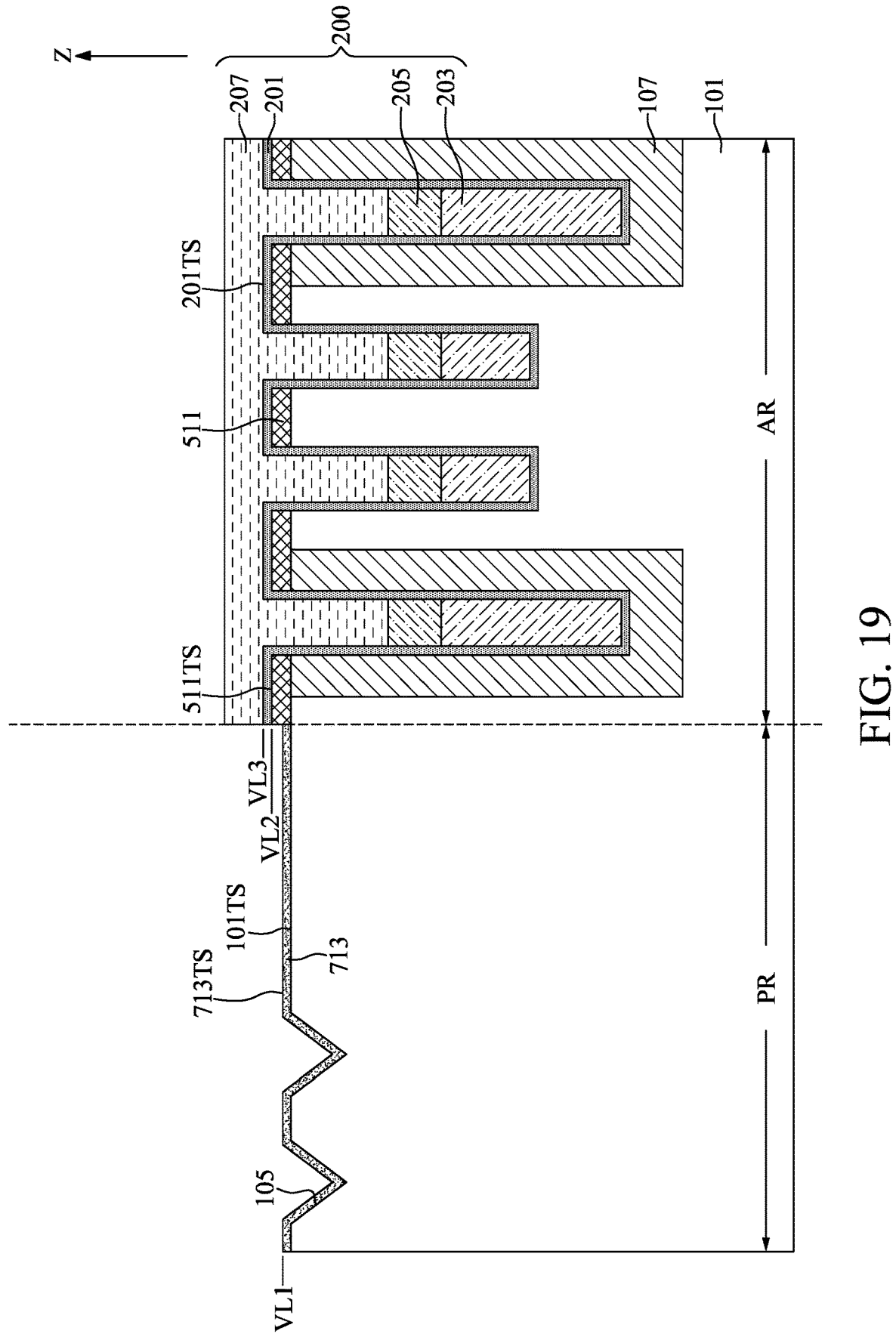

With reference to FIG. 19, a layer of second insulating material 713 may be conformally formed on the top surface 101TS of the peripheral region PR of the substrate 101 and on the plurality of valleys 105. In some embodiments, the layer of second insulating material 713 may include, for example, oxides, nitrides, oxynitrides, silicates (e.g., metal silicates), aluminates, titanates, nitrides, high-k dielectric materials, or a combination thereof. In some embodiments, the layer of second insulating material 713 may be formed by suitable deposition processes, for example, atomic layer deposition, chemical vapor deposition, plasma-enhanced chemical vapor deposition, evaporation, chemical solution deposition, or other suitable deposition processes. In some embodiments, the layer of second insulating material 713 may be formed by oxidizing the top surface 101TS of the substrate 101 and the plurality of valleys 105. In some embodiments, the thickness of the plurality of valleys 105 may vary depending on the deposition process as well as the composition and number of materials used. For example, the thickness of the layer of second insulating material 713 may be between about 10 angstroms and about 50 angstroms. In some embodiments, the layer of second insulating material 713 may include a multi-layered structure. For example, the layer of second insulating material 713 may be an oxide-nitride-oxide (ONO) structure. For another example, the layer of second insulating material 713 may include a bottom layer formed of silicon oxide and a top layer formed of high-k dielectric materials.

Examples of high-k dielectric materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric materials may further include dopants such as, for example, lanthanum and aluminum.

In some embodiments, an interfacial layer (not shown) may be optionally formed between the substrate 101 and the layer of second insulating material 713. The interfacial layer may be formed of, for example, silicon oxide, silicon nitride, silicon oxynitride, other semiconductor oxides, or a combination thereof. The interfacial layer may be formed to any suitable thickness using any suitable process including thermal growth, atomic layer deposition, chemical vapor deposition, high-density plasma chemical vapor deposition, spin-on deposition, or other suitable deposition processes. For example, the thickness of the interfacial layer may be between about 7 angstroms and 12 angstroms or between about 8 angstroms and 10 angstroms. The interfacial layer may facilitate the formation of the layer of second insulating material 713.

With reference to FIG. 19, the layer of second insulating material 713 formed on the plurality of valleys 105 may include a V-shaped cross-sectional profile. In some embodiments, the top surface 713TS of the layer of second insulating material 713 may be at the vertical level VL1 lower than the vertical level VL2 of the top surface 511TS of the first hard mask layer 511 or the vertical level VL3 of the top surface 201TS of the word line dielectric layer 201.

Figure 20:
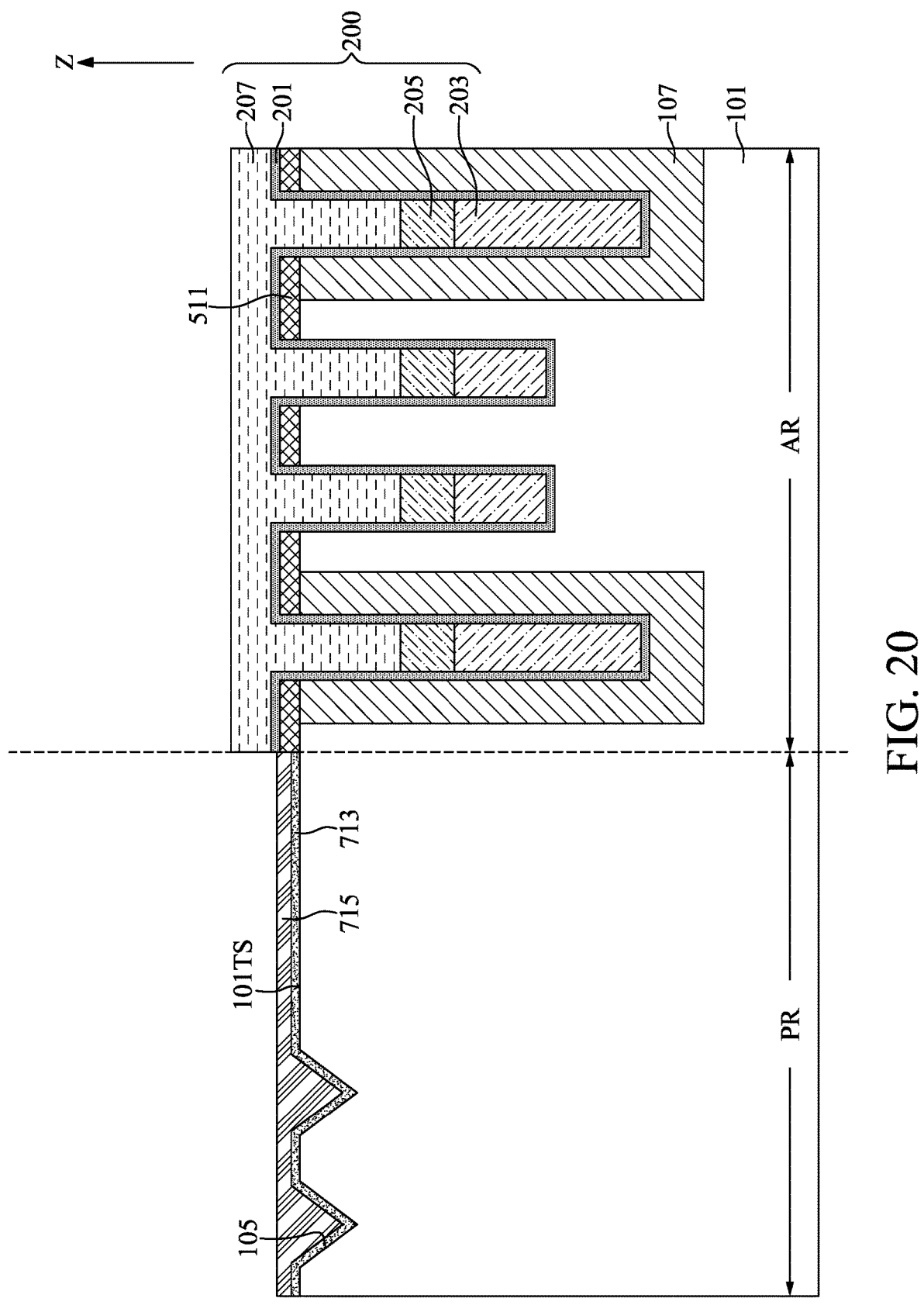

With reference to FIG. 20, a layer of first conductive material 715 may be formed on the layer of second insulating material 713. In some embodiments, the layer of first conductive material 715 may be formed of, for example, polycrystalline silicon, polycrystalline germanium, polycrystalline silicon germanium, doped polycrystalline silicon, doped polycrystalline germanium, doped polycrystalline silicon germanium, or other suitable conductive material. In some embodiments, the layer of first conductive material 715 may be doped with p-type dopants or n-type dopants. In some embodiments, the layer of first conductive material 715 formed in the plurality of valleys 105 may include a triangular shaped cross-sectional profile.

Figure 21:
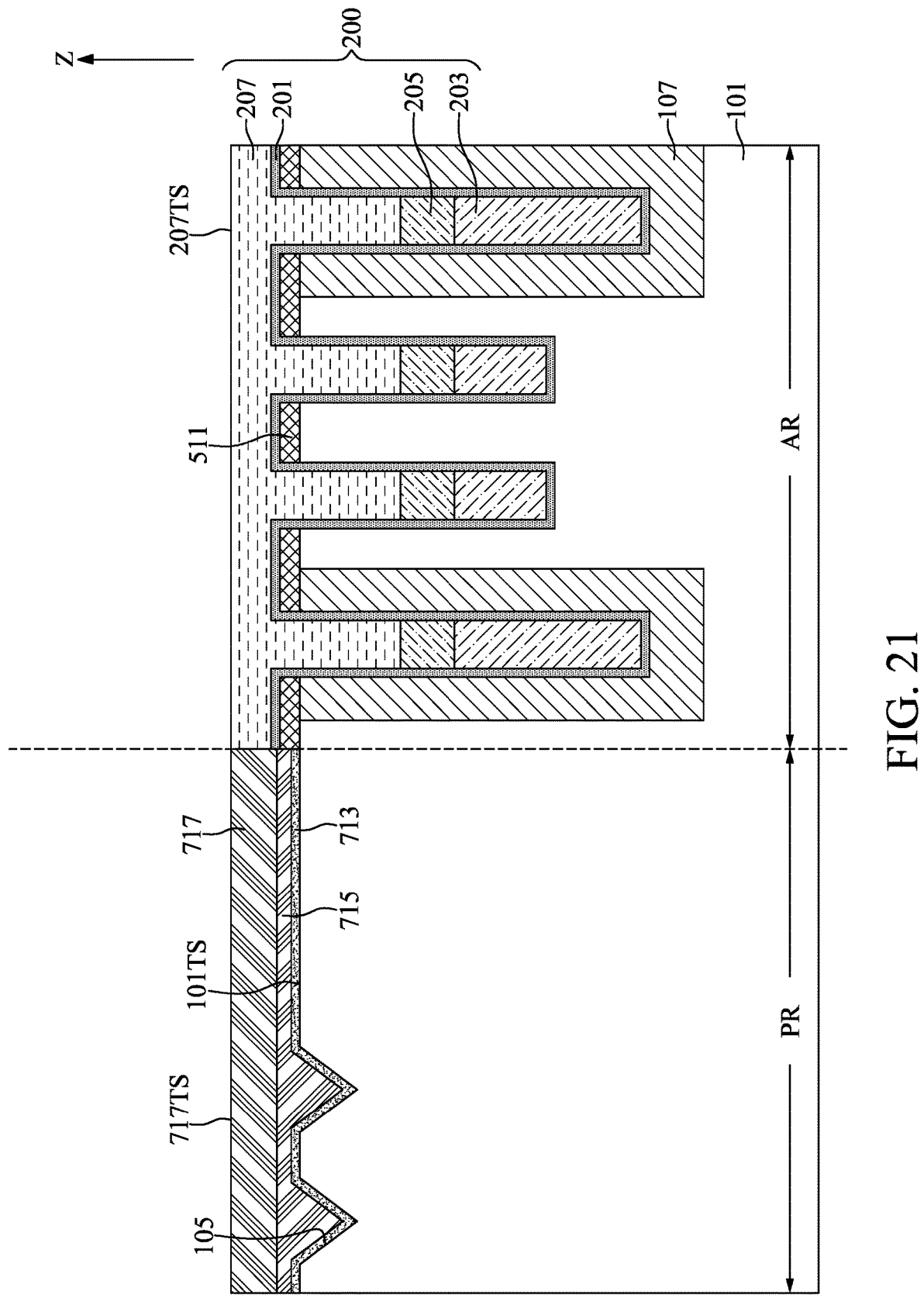

With reference to FIG. 21, a layer of second conductive material 717 may be formed on the layer of first conductive material 715. In some embodiments, the second conductive material 717 may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

With reference to FIG. 21, a planarization process, such as chemical mechanical polishing, may be performed until the top surface 207TS of the word line capping layer 207 is exposed to remove excess material and provide a substantially flat surface for subsequent processing steps. That is, the top surface 717TS of the layer of second conductive material 717 and the top surface 207TS of the word line capping layer 207 may be substantially coplanar.

Figure 22:
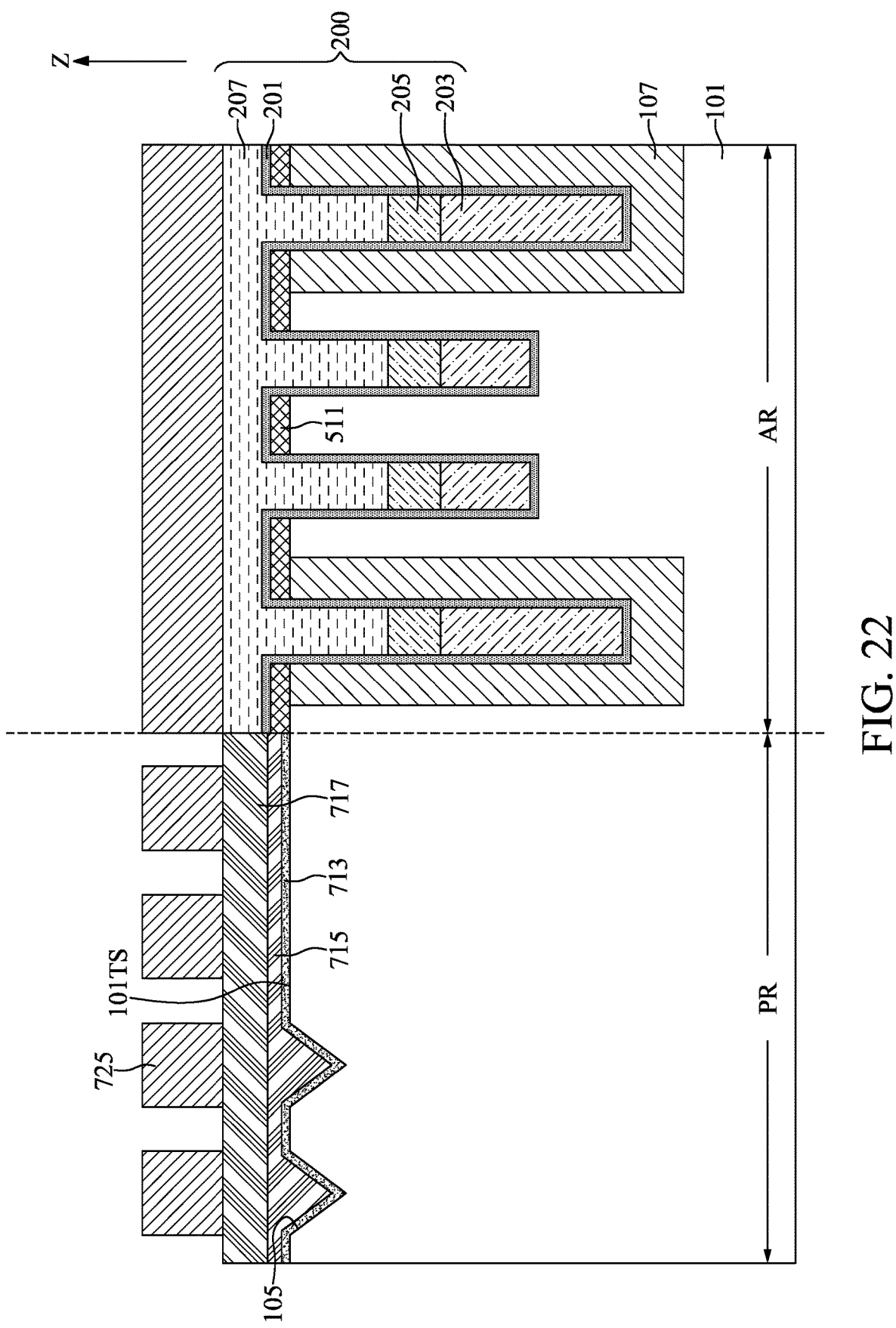

With reference to FIG. 22, a third mask layer 725 may be formed on the layer of second conductive material 717 and on the word line capping layer 207. In some embodiments, the third mask layer 725 may be a photoresist layer and may include a pattern of the plurality of programmable insulating layers 401 and the plurality of peripheral gate structures 300. The portions, which are formed above the plurality of valleys 105, of the second conductive material 717, the first conductive material 715, and the second insulating material 713 may be masked by the third mask layer 725.

Figure 23:
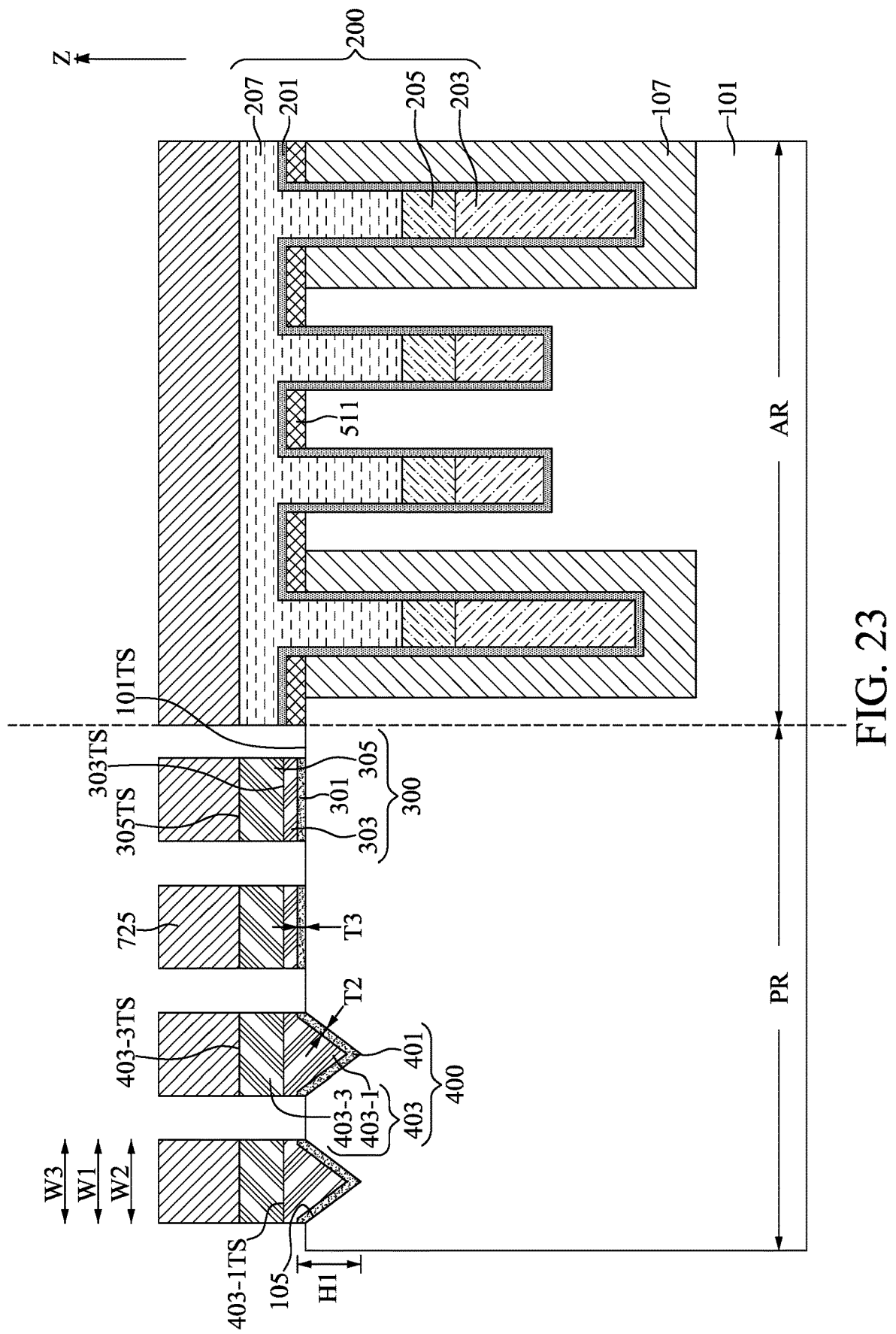

With reference to FIG. 23, an etching process may be performed using the third mask layer 725 as a mask to remove the portions, which are not masked by the third mask layer 725, of the second conductive material 717, the first conductive material 715, and the second insulating material 713. In some embodiments, the etching process may be a multi-stage etching process. For example, the etching process may be a two-stage anisotropic dry etching process. The etching chemistry may be different for each stage to provide different etching selectivity. In some embodiments, the etch rate ratio of the second conductive material 717 to the first conductive material 715 may be between about 100:1 and about 1.05:1, between about 15:1 and about 2:1, or between about 10:1 and about 2:1 during the first stage of the etching process. In some embodiments, the etch rate ratio of the first conductive material 715 to the second insulating material 713 may be between about 100:1 and about 1.05:1, between about 15:1 and about 2:1, or between about 10:1 and about 2:1 during the second stage of the etching process.

With reference to FIG. 23, the remaining second insulating material 713 may be turned into the plurality of programmable insulating layers 401 and a plurality of gate dielectric layers 301. The plurality of programmable insulating layers 401 may be conformally formed on the plurality of valleys 105. The plurality of programmable insulating layers 401 may include a V-shaped cross-sectional profile. The plurality of gate dielectric layers 301 may be formed on the peripheral region PR of the substrate 101 and may be separated from the plurality of programmable insulating layers 401. The plurality of gate dielectric layers 301 may include a cross-sectional profile different from the plurality of programmable insulating layers 401. In the present embodiment, the plurality of gate dielectric layers 301 may include a line-shaped cross-sectional profile. In some embodiments, the thickness T2 of the plurality of programmable insulating layers 401 and the thickness T3 of the plurality of gate dielectric layers 301 may be substantially the same. In some embodiments, the thickness T2 of the plurality of programmable insulating layers 401 and the thickness T3 of the plurality of gate dielectric layers 301 may be different from each other. In some embodiments, the width W1 of the plurality of programmable insulating layers 401 may be greater than or equal to the width W2 of the plurality of valleys 105. In some embodiments, the ratio of the width W1 of the programmable insulating layer 401 to the height H1 of the programmable insulating layer 401 may be between about 3:1 and about 1:1.

With reference to FIG. 23, the remaining first conductive material 715 may be turned into a plurality of bottom portions 403-1 and a plurality of gate bottom conductive layers 303. For brevity, clarity, and convenience of description, only one bottom portion 403-1 and one gate bottom conductive layer 303 are described. The bottom portion 403-1 may be formed on the corresponding programmable insulating layer 401. In some embodiments, the width W3 of the bottom portion 403-1 and the width W1 of the programmable insulating layer 401 may be substantially the same. In some embodiments, the bottom portion 403-1 may include a triangular shaped cross-sectional profile. In some embodiments, at least the bottom part, which contacts the programmable insulating layer 401, of the bottom portion 403-1 includes the triangular shaped cross-sectional profile. The gate bottom conductive layer 303 may be formed on the corresponding gate dielectric layer 301. In some embodiments, the top surface 303TS of the gate bottom conductive layer 303 and the top surface 403-1TS of the bottom portion 403-1 may be substantially coplanar.

With reference to FIG. 23, the remaining second conductive material 717 may be turned into a plurality of top portions 403-3 and a plurality of gate top conductive layers 305. For brevity, clarity, and convenience of description, only one top portion 403-3 and one gate top conductive layer 305 are described. The top portion 403-3 may be formed on the corresponding bottom portion 403-1. The top portion 403-3 may have the same width W3 as the bottom portion 403-1. The top portion 403-3 and the bottom portion 403-1 together configure the top electrode 403. The top electrode 403 and the programmable insulating layer 401 together configure the programmable structure 400. In some embodiments, the programmable structure 400 may be served as an anti-fuse.

An anti-fuse is non-conductive in the native unprogrammed state and becomes conductive when programmed. For example, the anti-fuse may be constructed with a thin dielectric layer sandwiched between two conductors. In some embodiments, the substrate 101 may serve as the lower conductor of the programmable structure 400. The top electrode 403 may serve as the upper conductor of the programmable structure 400. The programmable insulating layer 401 may serve as the dielectric layer sandwiched between the lower and the upper conductors. In the present embodiment, the programmable insulating layer 401 includes the V-shaped cross-sectional profile so that the top electrode 403 may include a tip part contacting the programmable insulating layer 401. During the programming procedure, charge accumulation may occur more easily in the tip part of the top electrode 403. Consequently, the required voltage (referred to as the programming voltage) for programming the programmable structure 400 can be reduced. This reduction in voltage helps to prevent potential damage to other elements of the semiconductor device 1A that may arise from high programming voltages.

With reference to FIG. 23, the gate top conductive layer 305 may be formed on the corresponding gate bottom conductive layer 303. The gate dielectric layer 301, the gate bottom conductive layer 303, the gate top conductive layer 305 together configure the peripheral gate structure 300. In some embodiments, the top surface 305TS of the gate top conductive layer 305 (i.e., the top surface of the peripheral gate structure 300), the top surface 403-3TS of the top portion 403-3 (i.e., the top surface of the top electrode 403), and the top surface 207TS of the word line capping layer 207 (i.e., the top surface of the word line structure 200) may be substantially coplanar.

Figure 24:
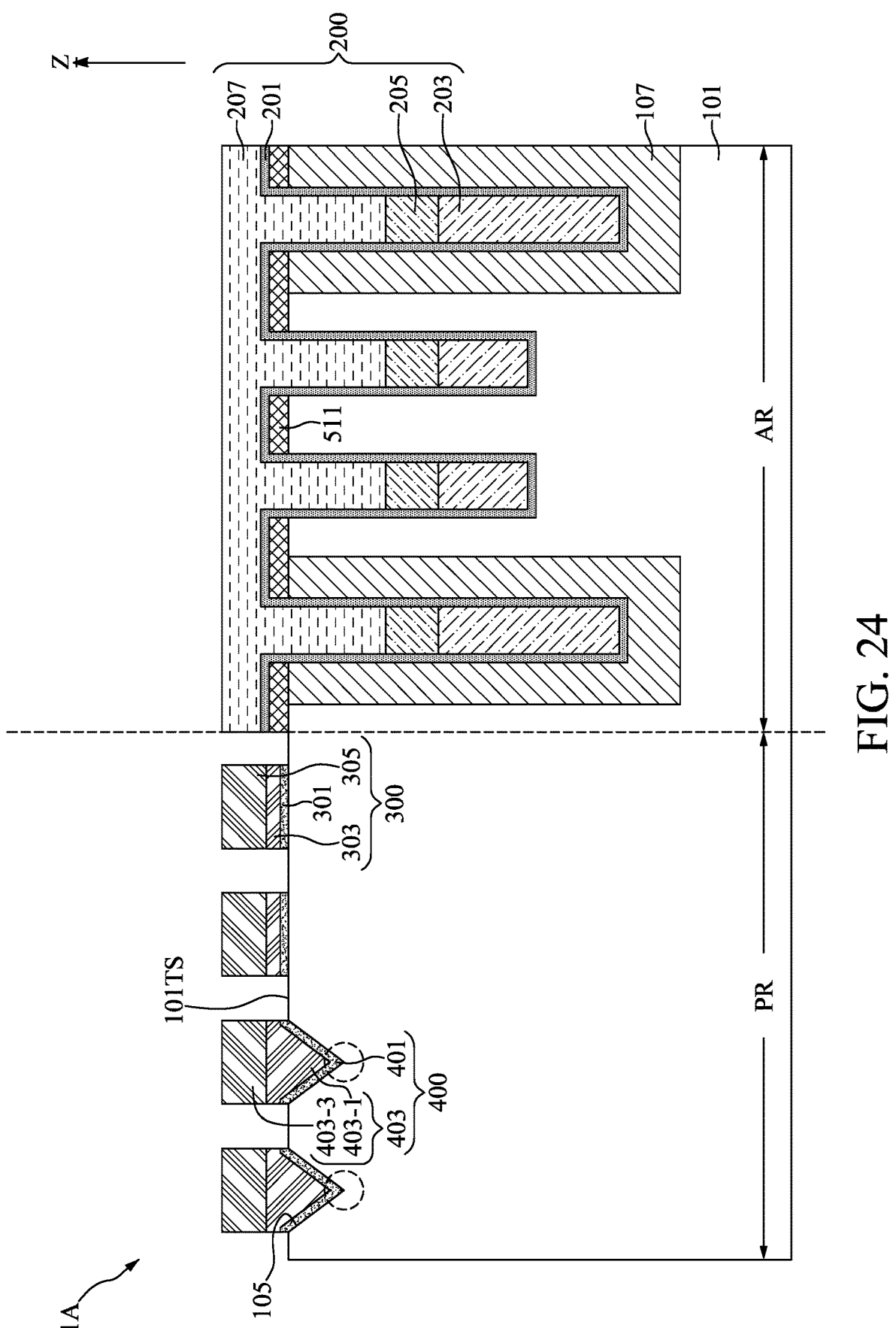

With reference to FIG. 24, the third mask layer 725 may be removed by an ashing process or other applicable semiconductor processes. When programming the programmable structure 400, a programming voltage may be applied to the top electrode 403 and the substrate 101 may be grounded, the programmable insulating layer 401 sandwiched by the top electrode 403 and the substrate 101 may be stressed under the programming voltage. As a result, the tip portion (shown in dashed circle) of the programmable insulating layer 401 will rupture to form a contiguous path connecting the top electrode 403 and the substrate 101. In other words, the tip portion of the programmable insulating layer 401 may be blown out and the programmable structure 400 is programmed. Due to the employment of the programmable insulating layer 401 including the V-shaped cross-sectional profile, the programming voltage may be reduced. For example, the programming voltage may be between about +4.0 volts and about +5.5 volts, between about +4.0 volts and about +5.0 volts, or between about +4.0 volts and about +4.5 volts. This reduction in programming voltage helps to prevent potential damage to other elements of the semiconductor device 1A that may arise from high programming voltages.

FIGS. 25 to 29 illustrate, in schematic cross-sectional view diagrams, semiconductor devices 1B, 1C, 1D, 1E, and 1F in accordance with some embodiments of the present disclosure.

Figure 25:
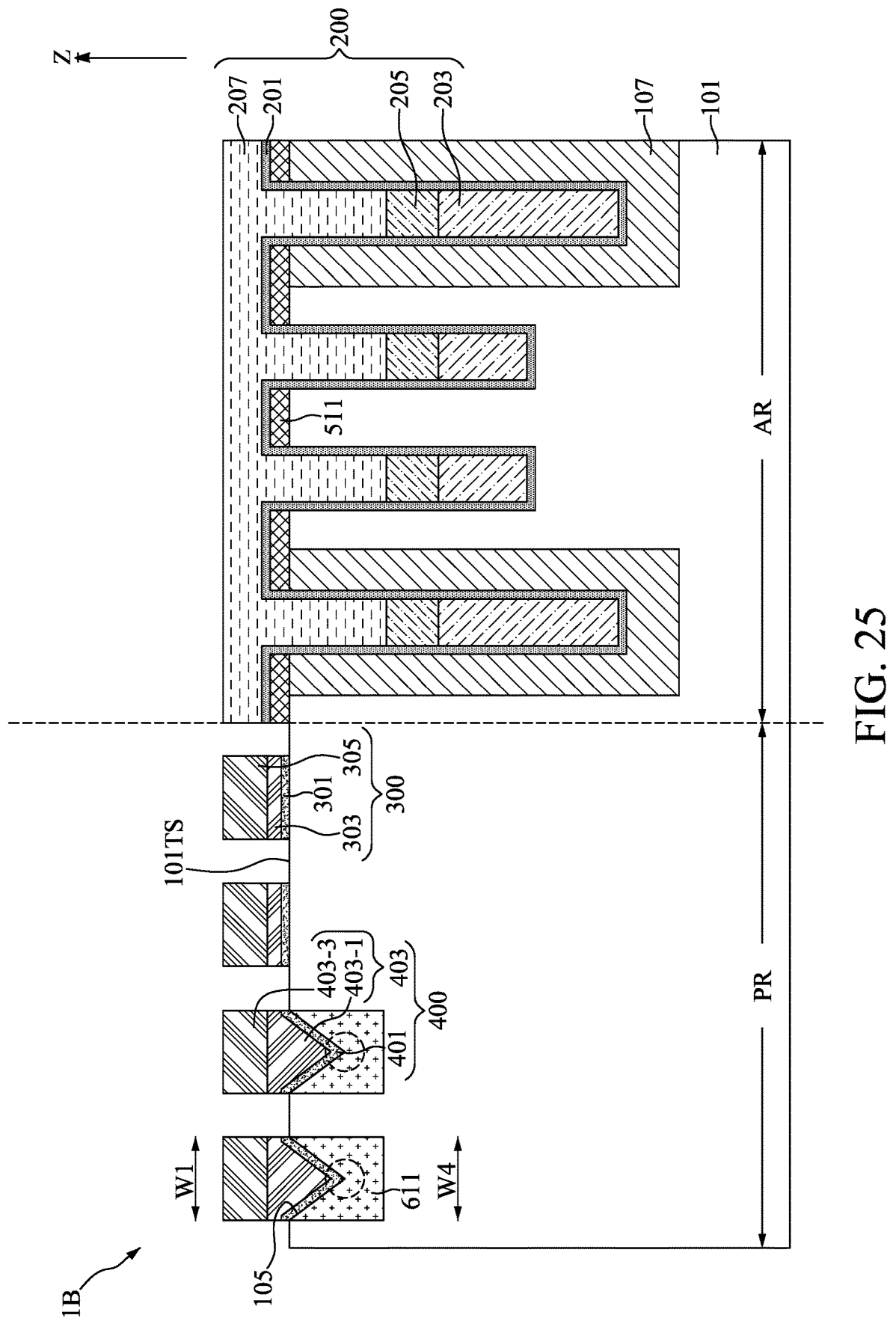
FIGS. 25 to 29 illustrate, in schematic cross-sectional view diagrams, semiconductor devices in accordance with some embodiments of the present disclosure.

With reference to FIG. 25, the semiconductor device 1B may have a structure similar to that illustrated in FIG. 24. The same or similar elements in FIG. 25 as in FIG. 24 have been marked with similar reference numbers and duplicative descriptions have been omitted.

The semiconductor device 1B may include a plurality of bottom conductive layers 611. For brevity, clarity, and convenience of description, only one bottom conductive layer 611 is described. The bottom conductive layer 611 may be disposed in the peripheral region PR of the substrate 101 and be disposed under the corresponding programmable insulating layer 401. In some embodiments, the bottom conductive layer 611 may be configured as the lower conductor of the programmable structure 400. In some embodiments, the bottom conductive layer 611 may be formed of, for example, doped silicon, doped germanium, doped silicon germanium. In some embodiments, the bottom conductive layer 611 may be doped with n-type dopants or p-type dopants and may have a first electrical type such as p-type or n-type. In some embodiments, the width W4 of the bottom conductive layer 611 may be greater than or equal to the the width W1 of the programmable insulating layer 401.

When programming the programmable structure 400, a programming voltage may be applied to the top electrode 403 and the bottom conductive layer 611 may be grounded, the programmable insulating layer 401 sandwiched by the top electrode 403 and the bottom conductive layer 611 may be stressed under the programming voltage. As a result, the tip portion (shown in dashed circle) of the programmable insulating layer 401 will rupture to form a contiguous path connecting the top electrode 403 and the bottom conductive layer 611. In other words, the tip portion of the programmable insulating layer 401 may be blown out and the programmable structure 400 is programmed. Due to the employment of the programmable insulating layer 401 including the V-shaped cross-sectional profile, the programming voltage may be reduced. For example, the programming voltage may be between about +4.0 volts and about +5.5 volts, between about +4.0 volts and about +5.0 volts, or between about +4.0 volts and about +4.5 volts. This reduction in programming voltage helps to prevent potential damage to other elements of the semiconductor device 1B that may arise from high programming voltages.

Figure 26:
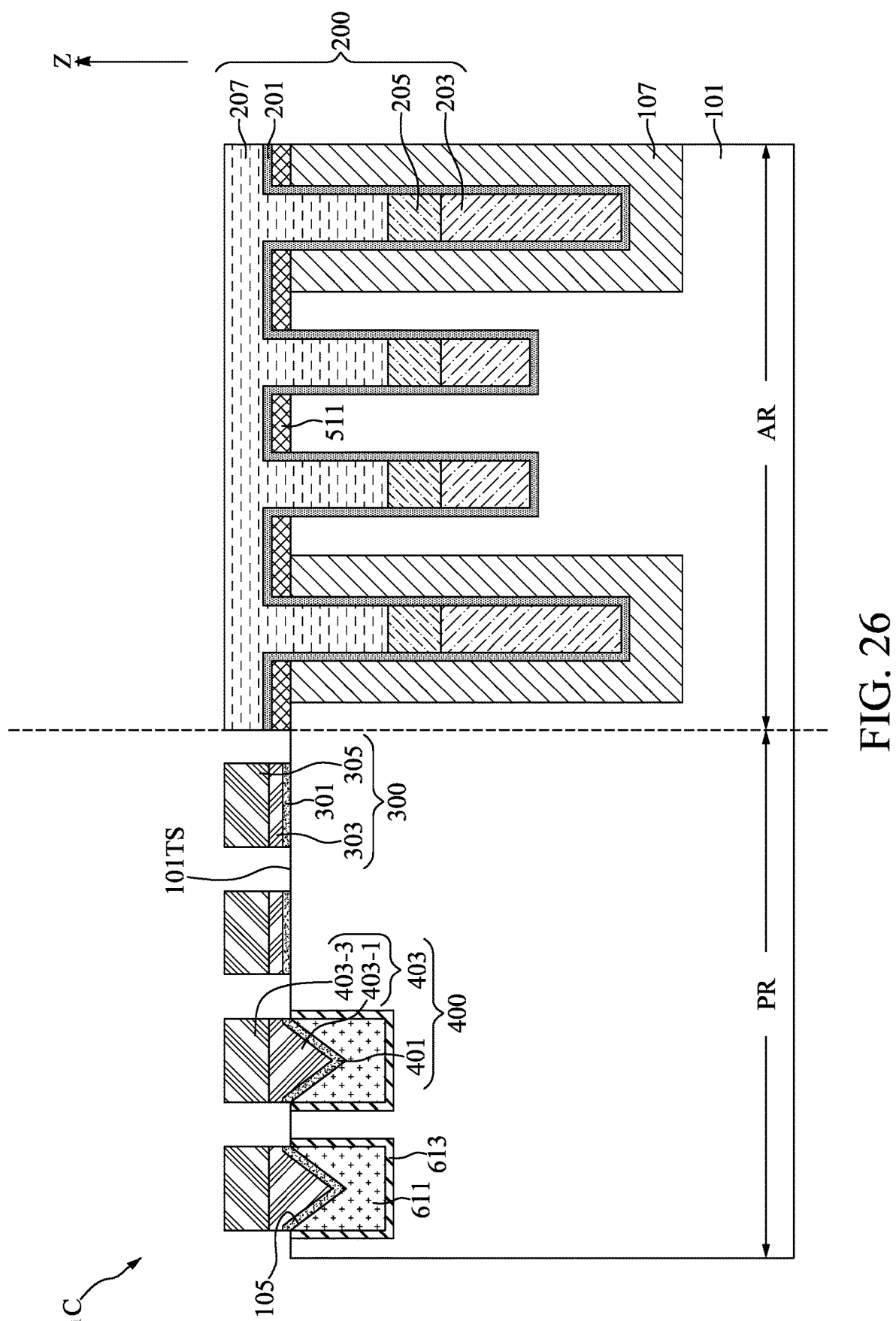

With reference to FIG. 26, the semiconductor device 1C may have a structure similar to that illustrated in FIG. 25. The same or similar elements in FIG. 26 as in FIG. 25 have been marked with similar reference numbers and duplicative descriptions have been omitted.

The semiconductor device 1C may include a plurality of enveloping insulating layers 613. For brevity, clarity, and convenience of description, only one enveloping insulating layer 613 is described. In some embodiments, the enveloping insulating layer 613 may be disposed in the peripheral region PR of the substrate 101 and may surround the corresponding bottom conductive layer 611. In some embodiments, the enveloping insulating layer 613 may be configured to electrically isolate the bottom conductive layer 611 from the substrate 101. In some embodiments, the enveloping insulating layer 613 may be formed of, for example, silicon oxide, silicon nitride, or other applicable insulating materials.

Figure 27:
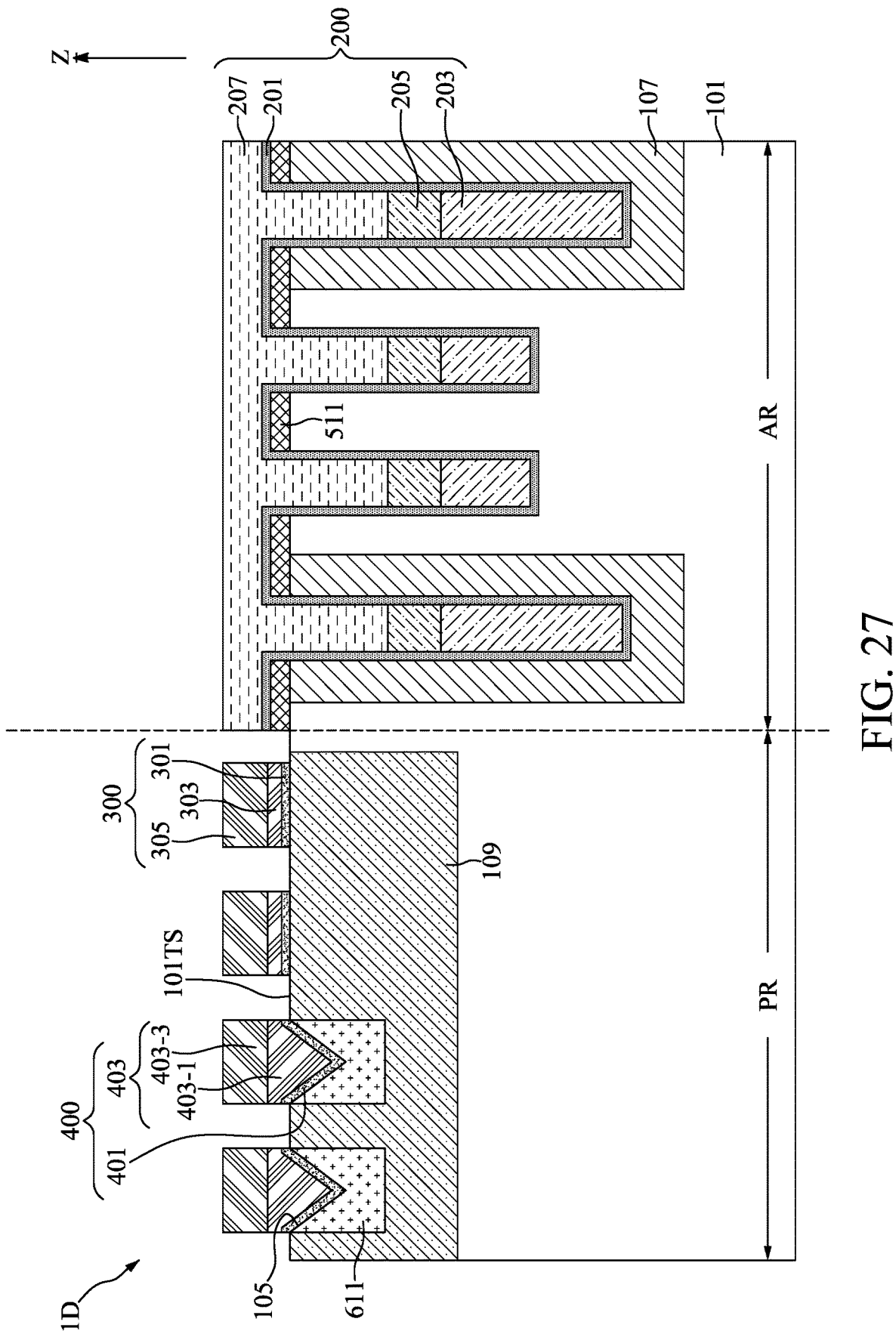

With reference to FIG. 27, the semiconductor device 1D may have a structure similar to that illustrated in FIG. 25. The same or similar elements in FIG. 27 as in FIG. 25 have been marked with similar reference numbers and duplicative descriptions have been omitted.

The semiconductor device 1D may include a well 109. The well 109 may be disposed in the peripheral region PR of the substrate 101. The plurality of bottom conductive layers 611 may be formed in the well 109. The well 109 may be doped with n-type dopants or p-type dopants. The well 109 may have a second electrical type different from the first electrical type of the plurality of bottom conductive layers 611. The interfaces between the plurality of bottom conductive layers 611 and the well 109 may be referred to as P-N junctions.

Figure 28:
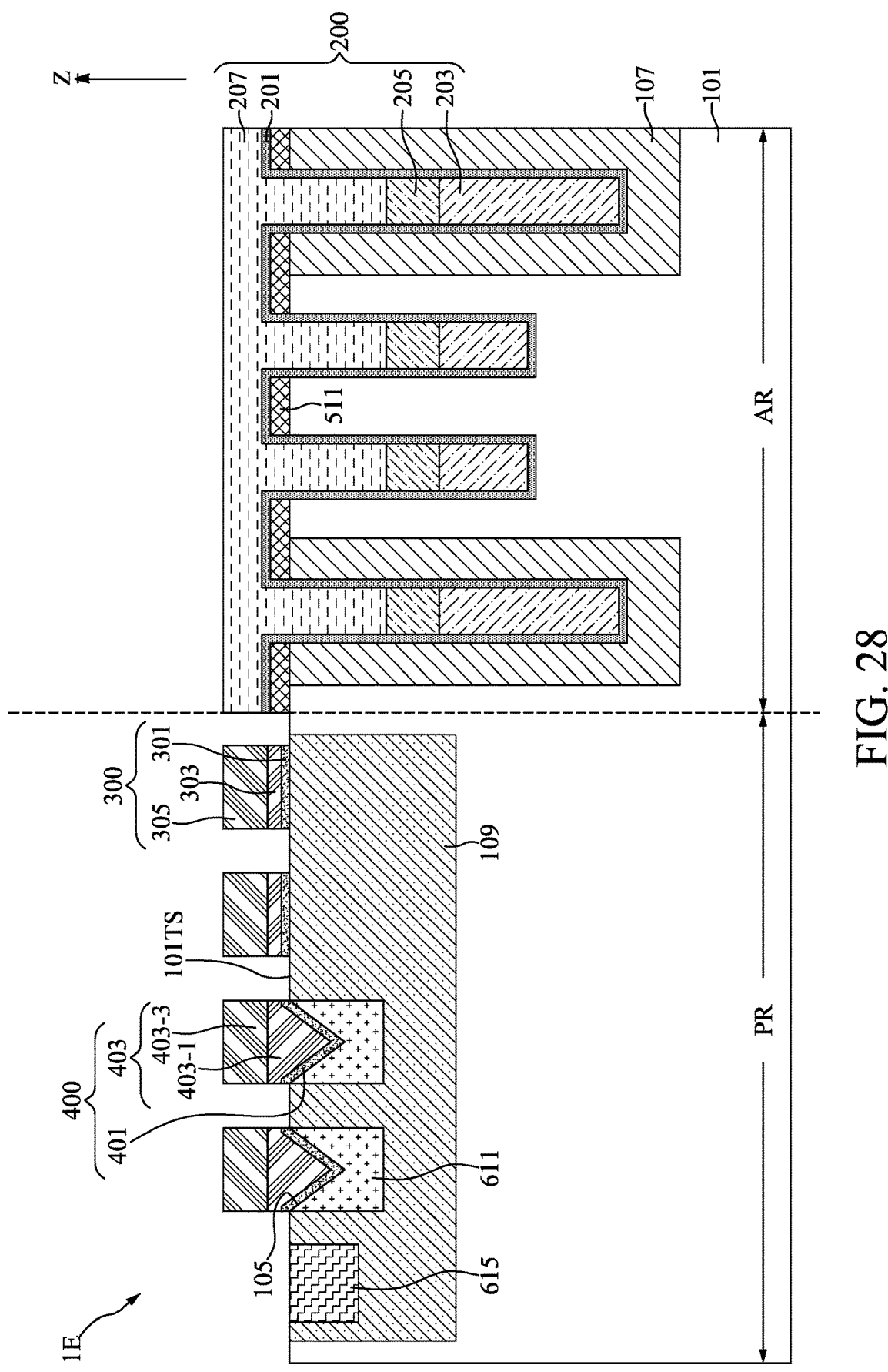

With reference to FIG. 28, the semiconductor device 1E may have a structure similar to that illustrated in FIG. 27. The same or similar elements in FIG. 28 as in FIG. 27 have been marked with similar reference numbers and duplicative descriptions have been omitted.

The semiconductor device 1E may include a biased conductive layer 615. The biased conductive layer 615 may be disposed in the well 109 and may be separated from the plurality of bottom conductive layers 611. In some embodiments, the biased conductive layer 615 may be doped with the same type of dopants as the plurality of bottom conductive layers 611. That is, the biased conductive layer 615 may have the same electrical type (i.e., the first electrical type) as the plurality of bottom conductive layers 611. The biased conductive layer 615 may be configured to be applied a biased voltage. The value of biased voltage may be less than the value of the baseline voltage (e.g., ground voltage for the plurality of bottom conductive layers 611). For example, the value of the biased voltage may be, for example, −1 volts, −2 volts, −3 volts, or any number between −0.5 volts and −3 volts. Depletion region (not shown) may be formed surrounding the plurality of bottom conductive layers 611 when the biased voltage is applied to the biased conductive layer 615 and the baseline voltage is applied to the plurality of bottom conductive layers 611. The depletion regions may serve as electrical isolation for the plurality of bottom conductive layers 611.

Figure 29:
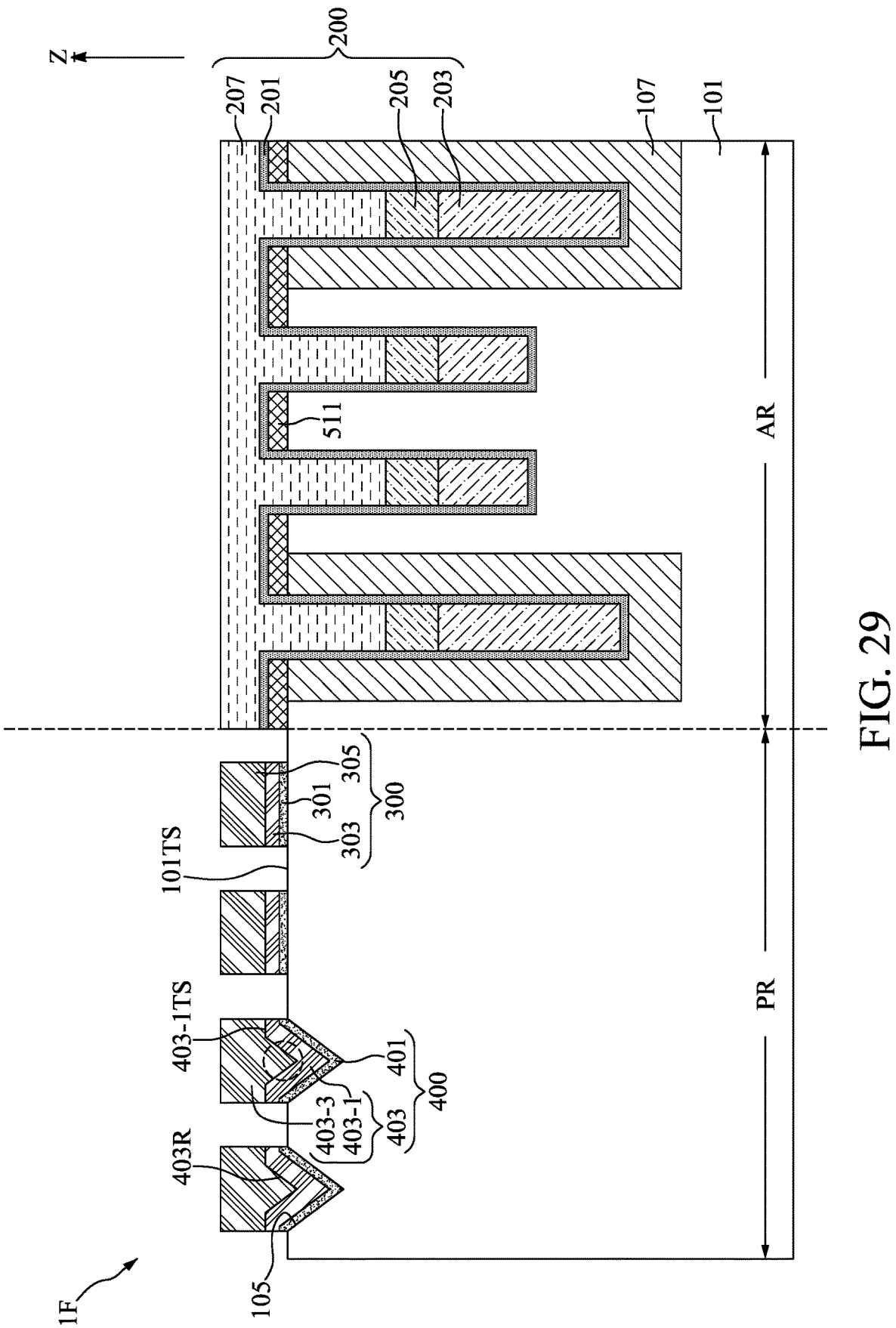

With reference to FIG. 29, the semiconductor device 1F may have a structure similar to that illustrated in FIG. 24. The same or similar elements in FIG. 29 as in FIG. 24 have been marked with similar reference numbers and duplicative descriptions have been omitted.

In the semiconductor device 1F, a recess 403R may be disposed on the top surface 403-1TS of the bottom portion 403-1. The top portion 403-3 may further include a tip portion (shown in dashed circle) extending to the recess 403R.

One aspect of the present disclosure provides a semiconductor device including a substrate; a valley inwardly positioned on a top surface of the substrate; a programmable insulating layer conformally positioned on the valley and including a V-shaped cross-sectional profile; and a top electrode positioned on the programmable insulating layer. The programmable insulating layer is configured to be blown out under a programming voltage.

Another aspect of the present disclosure provides a semiconductor device including a substrate including an array region and a peripheral region positioned adjacent to the array region; a valley inwardly positioned on a top surface of the peripheral region of the substrate; a programmable insulating layer conformally positioned on the valley and including a V-shaped cross-sectional profile; a top electrode positioned on the programmable insulating layer; a peripheral gate structure positioned on the top surface of the peripheral region of the substrate. The programmable insulating layer is configured to be blown out under a programming voltage.

Another aspect of the present disclosure provides a method for fabricating a semiconductor device including providing a substrate; forming an under layer on the substrate; forming a mask layer on the under layer; forming a first protection layer on the under layer and covering the mask layer; removing a portion of the first protection layer to expose the mask layer; removing the mask layer to expose a portion of the under layer; removing a portion of the under layer using the first protection layer as a mask to form an opening exposing a portion of the substrate; performing a valley etching process to remove a portion of the substrate and form a valley on a top surface of the substrate; conformally forming programmable insulating layer on the valley; and forming a top electrode on the programmable insulating layer. The programmable insulating layer includes a V-shaped cross-sectional profile and is configured to be blown out under a programming voltage.

Due to the design of the semiconductor device of the present disclosure, the programming voltage may be reduced by employing the programmable insulating layer 401 including the V-shaped cross-sectional profile. This reduction in programming voltage helps to prevent potential damage to other elements of the semiconductor device 1A that may arise from high programming voltages.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate;
a valley inwardly positioned on a top surface of the substrate;
a programmable insulating layer conformally positioned on the valley and comprising a V-shaped cross-sectional profile to define two top ends; and
a top electrode positioned on the programmable insulating layer at a position that a top surface of the top electrode is located above the top surface of the substrate;
wherein a width of the valley is equal to a width of the programmable insulating layer between the top ends thereof, and is equal to a width of the top electrode;
wherein the programmable insulating layer is configured to be blown out under a programming voltage;
wherein the top electrode comprises a bottom portion positioned on the programmable insulating layer and a top portion positioned on the bottom portion, wherein a top surface of the bottom portion of the top electrode is located above the top surface of the substrate, wherein a width of the bottom portion at the top surface thereof is equal to a width of the top portion at a top surface thereof.

2. The semiconductor device of claim 1, wherein the programmable insulating layer comprises oxides, nitrides, oxynitrides, silicates, aluminates, titanates, high-k dielectric materials, or a combination thereof.

3. The semiconductor device of claim 2, further comprising a bottom conductive layer positioned in the substrate and contacting the programmable insulating layer, wherein a width of the bottom conductive layer is equal to the width of the programmable insulating layer between the top ends thereof.

4. The semiconductor device of claim 3, wherein the bottom portion comprises doped polycrystalline silicon, doped polycrystalline germanium, or doped polycrystalline silicon germanium.

5. The semiconductor device of claim 4, wherein a crystal orientation of the substrate is <110>, <100>, or <111>.

6. The semiconductor device of claim 5, wherein the top portion comprises tungsten, cobalt, zirconium, tantalum, titanium, aluminum, ruthenium, copper, metal carbides, metal nitrides, transition metal aluminides, or a combination thereof.

7. The semiconductor device of claim 6, wherein the programming voltage is applied to the top electrode and the bottom conductive layer is grounded.

8. The semiconductor device of claim 7, wherein the bottom conductive layer comprises n-type dopants or p-type dopants.

\* \* \* \* \*